US012464895B2

(12) United States Patent
Kim et al.

(10) Patent No.: US 12,464,895 B2
(45) Date of Patent: Nov. 4, 2025

(54) DISPLAY DEVICE

(71) Applicant: Samsung Display Co., Ltd., Yongin-si (KR)

(72) Inventors: Sunho Kim, Seongnam-si (KR); Juchan Park, Seoul (KR); Yoomin Ko, Suwon-si (KR); Hyewon Kim, Seoul (KR); Sun Hee Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 588 days.

(21) Appl. No.: 17/745,897

(22) Filed: May 17, 2022

(65) Prior Publication Data

US 2022/0384552 A1 Dec. 1, 2022

(30) Foreign Application Priority Data

May 27, 2021 (KR) .................. 10-2021-0068521

(51) Int. Cl.
*H10K 59/121* (2023.01)
*H10K 59/131* (2023.01)

(52) U.S. Cl.
CPC ....... *H10K 59/1213* (2023.02); *H10K 59/121* (2023.02); *H10K 59/1216* (2023.02); *H10K 59/131* (2023.02)

(58) Field of Classification Search
CPC ............. H10K 59/1213; H10K 59/121; H10K 59/1216; H10K 59/131; H10K 59/1201;
(Continued)

(56) References Cited

U.S. PATENT DOCUMENTS 7,742,019 B2 6/2010 Takahara
7,777,698 B2 8/2010 Takahara et al.
(Continued)

FOREIGN PATENT DOCUMENTS

KR 10-2007-0099701 10/2007
KR 10-2015-0096022 8/2015
(Continued)

OTHER PUBLICATIONS

OLED-info.com "Pentile," (Year: 2012).*
Korean Office Action with English translation for Korean Patent Application No. 10-2021-0068521, dated Nov. 4, 2024.

*Primary Examiner* — Steven B Gauthier
*Assistant Examiner* — Alvin L Lee
(74) *Attorney, Agent, or Firm* — Sughrue Mion, PLLC

(57) ABSTRACT

A display device includes a substrate, a circuit layer disposed on the substrate, and which includes a pixel circuit part having a first pixel circuit region and a second pixel circuit region, and a driving circuit part that is adjacent to the pixel circuit part, and a display layer disposed on the circuit layer, and which includes including a first display element region that overlaps the first pixel circuit region, a second display element region that overlaps the second pixel circuit region, and a third display element region that overlaps the driving circuit part, pixel circuits formed in the first pixel circuit region supply a first current to display elements formed in the first display element region, and pixel circuits formed in the second pixel circuit region supply a second current to display elements formed in the second and third display element regions.

32 Claims, 24 Drawing Sheets

(58) Field of Classification Search
CPC ...... H10K 59/35; H10D 12/01; G09G 3/3258; G09G 2300/0426; G09G 2310/0232; G09G 2310/0264; G09G 2320/0233; G09G 2320/0626
See application file for complete search history.

(56) References Cited

U.S. PATENT DOCUMENTS

| | | |
|---|---|---|
| 7,924,248 B2 | 4/2011 | Takahara |
| 7,932,880 B2 | 4/2011 | Takahara et al. |
| 8,063,855 B2 | 11/2011 | Takahara et al. |
| 8,508,438 B2 | 8/2013 | Suh |
| 10,147,777 B2 | 12/2018 | Lim et al. |
| 11,061,295 B2 | 7/2021 | Bang et al. |
| 11,403,997 B2 | 8/2022 | Kwag et al. |
| 11,790,837 B2 | 10/2023 | Kwag et al. |
| 2015/0228223 A1 | 8/2015 | Park |
| 2018/0047799 A1* | 2/2018 | Lim ................ H10K 59/88 |
| 2020/0006448 A1* | 1/2020 | Chen ............. G06V 40/1365 |
| 2020/0133040 A1* | 4/2020 | Bang ............... G02F 1/1333 |
| 2021/0012706 A1* | 1/2021 | Yang .................. G09G 3/32 |
| 2021/0319750 A1* | 10/2021 | Ueno ............... G09G 3/3233 |
| 2021/0407369 A1* | 12/2021 | Li .................. G09G 3/2074 |
| 2024/0276808 A1* | 8/2024 | Fang ............... H10K 59/131 |

FOREIGN PATENT DOCUMENTS

| | | |
|---|---|---|
| KR | 10-2018-0018960 | 2/2018 |
| KR | 10-2020-0042075 | 4/2020 |
| KR | 10-2020-0050059 | 5/2020 |

\* cited by examiner

DISPLAY DEVICE

CROSS-REFERENCE TO RELATED APPLICATION

This application claims priority from and the benefit of Korean Patent Application No. 10-2021-0068521, filed on May 27, 2021, which is hereby incorporated by reference for all purposes as if fully set forth herein.

BACKGROUND

Field

Embodiments of the invention relate generally to a display device and, more specifically, to a display device having a reduced non-display area.

Discussion of the Background

In general, a display device such as a liquid crystal display device, an electrowetting display device, an electrophoretic display device, and an organic light emitting display device may include a plurality of pixels. Each of the pixels may include at least one thin film transistor and a display element connected to the thin film transistor.

The display device may include a scan driver, an emission driver, and a data driver to drive the pixels. In this case, since the pixels are not disposed on the drivers, an image may not be displayed in locations where the drivers are located. In other words, a region in which the drivers are disposed may be a non-display region in which an image is not displayed.

Since the non-display region limits an area of a display region in which an image displayed in the display device, it is desirable to reduce the size of the non-display region and thereby increase the size of the display region.

The above information disclosed in this Background section is only for understanding of the background of the inventive concepts, and, therefore, it may contain information that does not constitute prior art.

SUMMARY

Devices constructed according to illustrative implementations of the invention are capable of preventing a decrease in luminance of an image being displayed by a device when a pixel density of the device is decreased.

The embodiments described hereinbelow enable a display device to prevent a decrease in a luminance that may be caused by a decrease in a pixel density even when a display area is expanded by reducing a non-display area.

Additional features of the inventive concepts will be set forth in the description that follows, and in part will be apparent from the description, or may be learned by practice of the inventive concepts.

A display device according to an embodiment may include a substrate, a circuit layer disposed on the substrate, and that includes a pixel circuit part having a first pixel circuit region and a second pixel circuit region, and a driving circuit part that is adjacent to the pixel circuit part, and a display layer disposed on the circuit layer, and that includes a first display element region that overlaps the first pixel circuit region, a second display element region that overlaps the second pixel circuit region, and a third display element region that overlaps the driving circuit part. Pixel circuits formed in the first pixel circuit region may supply a first current to display elements formed in the first display element region, and pixel circuits formed in the second pixel circuit region may supply a second current to display elements formed in the second and third display element regions.

In an embodiment, the second current may be greater than the first current.

In an embodiment, a driving transistor formed in each of the first and second pixel circuit regions may control an amount of a current flowing from a first power supply to a second power supply via the display element, and the display element may include an organic light emitting element.

In an embodiment, a light emitting region of an organic light emitting element formed in each of the second and third display element regions may be two times or more greater than a light emitting region of an organic light emitting element formed in the first pixel circuit region.

In an embodiment, a channel width of a driving transistor formed in the second pixel circuit region may be greater than a channel width of a driving transistor formed in the first pixel circuit region.

In an embodiment, a channel width/channel length (W/L) of a driving transistor formed in the second pixel circuit region may be two times or more greater than a W/L of a driving transistor formed in the first pixel circuit region.

In an embodiment, an area of a storage capacitor formed in the second pixel circuit region may be greater than an area of a storage capacitor formed in the first pixel circuit region.

In an embodiment, in the second pixel circuit region, pixel circuits may be arranged in an odd-numbered region of a $4n^{th}$ row (n is a positive integer greater than or equal to one), pixel circuits may be arranged in an even-numbered region of a $(4n-1)^{th}$ row, pixel circuits may be arranged in an even-numbered region of a $(4n-2)^{th}$ row, and pixel circuits may be arranged in an odd-numbered region of a $(4n-3)^{th}$ row.

In an embodiment, display elements corresponding to each of the second and third display element regions may expand in a lateral direction.

In an embodiment, the pixel circuits arranged in the odd-numbered region of the $4n^{th}$ row may drive display elements arranged in a region of a $4n^{th}$ row of the display layer, the pixel circuits arranged in the even-numbered region of the $(4n-1)^{th}$ row may drive display elements arranged in a region of a $(4n-1)^{th}$ row of the display layer, the pixel circuits arranged in the even-numbered region of the $(4n-2)^{th}$ row may drive display elements arranged in a region of a $(4n-2)^{th}$ row of the display layer, and the pixel circuits arranged in the odd-numbered region of the $(4n-3)^{th}$ row may drive display elements arranged in a region of a $(4n-3)^{th}$ row of the display layer.

In an embodiment, the pixel circuits arranged in the odd-numbered region of the $4n^{th}$ row may drive display elements arranged in a region of a $(4n-1)^{th}$ row of the display layer, the pixel circuits arranged in the even-numbered region of the $(4n-1)^{th}$ row may drive display elements arranged in a region of a $4n^{th}$ row of the display layer, the pixel circuits arranged in the even-numbered region of the $(4n-2)^{th}$ row may drive display elements arranged in a region of a $(4n-2)^{th}$ row of the display layer, and the pixel circuits arranged in the odd-numbered region of the $(4n-3)^{th}$ row may drive display elements arranged in a region of a $(4n-3)^{th}$ row of the display layer.

In an embodiment, the display element may include an organic light emitting element, and in order for the pixel circuits arranged in the odd-numbered region of the $4n^{th}$ row to drive organic light emitting elements arranged in the region of the $(4n-1)^{th}$ row of the display layer, an anode of an organic light emitting element formed in the third display element region may extend to the second display element region so as to be connected to a driving transistor of a pixel circuit.

In an embodiment, the display element may include an organic light emitting element, and in order for the pixel circuits arranged in the even-numbered region of the $(4n-1)^{th}$ row to drive organic light emitting elements arranged in the region of the $4n^{th}$ row of the display layer, an anode of an organic light emitting element formed in the third display element region may extend to the second display element region so as to be connected to a driving transistor of a pixel circuit.

In an embodiment, in the second pixel circuit region, pixel circuits may be arranged in a region of a $4n^{th}$ row (n is a positive integer greater than one equal to one), and pixel circuits are arranged in a region of a $(4n-3)^{th}$ row.

In an embodiment, display elements corresponding to each of the second and third display element regions may expand in a longitudinal direction.

In an embodiment, the pixel circuits arranged in the region of the $4n^{th}$ row may drive display elements arranged in a region of a $4n^{th}$ row of the display layer and expanding in the longitudinal direction, and the pixel circuits arranged in the region of the $(4n-3)^{th}$ row may drive display elements arranged in a region of a $(4n-3)^{th}$ row of the display layer and expanding in the longitudinal direction.

In an embodiment, pixel circuits provided in the circuit layer and display elements provided in the display layer may form a PenTile® pixel structure.

A display device according to an embodiment may include a substrate, a circuit layer disposed on the substrate, and that includes a pixel circuit part having a first pixel circuit region provided with a plurality of first pixel circuits and a second pixel circuit region provided with a plurality of second pixel circuits connected to scan lines to which the first pixel circuits are connected, respectively, and a driving circuit part that is adjacent to the pixel circuit part, and a display layer disposed on the circuit layer, and that includes a first display element region that overlaps the first pixel circuit region and provided with a plurality of first display elements connected to the first pixel circuits, respectively, a second display element region that overlaps the second pixel circuit region and provided with a plurality of second display elements connected to a half of the second pixel circuits, respectively, and a third display element region that overlaps the driving circuit part and provided with a plurality of third display elements connected to a remaining half of the second pixel circuits, respectively. A channel width of a driving transistor provided in the second pixel circuit may be greater than a channel width of a driving transistor provided in the first pixel circuit.

In an embodiment, a channel width/channel length (W/L) of a driving transistor formed in the second pixel circuit region may be two times or more greater than a W/L of a driving transistor formed in the first pixel circuit region.

In an embodiment, a light emitting region of a display element formed in each of the second and third display element regions may be two times of more greater than a light emitting region of a display element formed in the first pixel circuit region.

In an embodiment, a light emitting region of a display element formed in each of the second and third display element regions may expand more as compared with a light emitting region of a display element formed in the first pixel circuit region.

In an embodiment, a light emitting region of a display element formed in each of the second and third display element regions may expand in a lateral direction.

A display device according to an embodiment may include a substrate, a circuit layer disposed on the substrate, and including a pixel circuit part having a first pixel circuit region provided with a plurality of first pixel circuits and a second pixel circuit region provided with a plurality of second pixel circuits connected to half of scan lines to which the first pixel circuits are connected, and a driving circuit part that is adjacent to the pixel circuit part, and a display layer disposed on the circuit layer, and including a first display element region overlapping the first pixel circuit region and provided with a plurality of first display elements connected to the first pixel circuits, respectively, a second display element region overlapping the second pixel circuit region and provided with a plurality of second display elements connected to a half of the second pixel circuits, respectively, and a third display element region overlapping the driving circuit part and provided with a plurality of third display elements connected to a remaining half of the second pixel circuits, respectively. A channel width of a driving transistor provided in the second pixel circuit may be greater than a channel width of a driving transistor provided in the first pixel circuit.

In an embodiment, a light emitting region of a display element formed in each of the second and third display element regions may expand in a longitudinal direction.

In an embodiment, a light emitting region of a display element formed in each of the second and third display element regions may expand in a lateral direction.

In an embodiment, the second pixel circuit may include a first thin film transistor including a drain electrode connected to a lower electrode of a second display element, which is formed in the second display element region, via a first contact metal, and a second thin film transistor including a drain electrode connected to a lower electrode of a third display element, which is formed in the third display element region, via a second contact metal.

In an embodiment, a second pixel circuit formed in a $4n^{th}$ row (n is a positive integer greater than or equal to one) may be connected to a display element formed in a $(4n-1)^{th}$ row via a second contact metal extending to the third display element region, and a second pixel circuit formed in a $(4n-1)^{th}$ row may be connected to a display element formed in a $4n^{th}$ row via a second contact metal extending to the third display element region.

In an embodiment, in the second pixel circuit region, pixel circuits may be provided in an odd-numbered row, and pixel circuits may be deleted in an even-numbered row.

In an embodiment, an odd-numbered display element formed in an odd-numbered row of each of the second and third display element regions may be connected to an odd-numbered pixel circuit in the odd-numbered row of the second pixel circuit region, and an even-numbered display element formed in an even-numbered row of each of the second and third display element regions may be connected to an even-numbered pixel circuit in the odd-numbered row of the second pixel circuit region.

In an embodiment, in the second pixel circuit region, pixel circuits may be provided in a $4n^{th}$ row and a $(4n-3)^{th}$ row, and pixel circuits may be deleted in a $(4n-1)^{th}$ row and a $(4n-2)^{th}$ row.

In an embodiment, an odd-numbered display element formed in a $4n^{th}$ row and a $(4n-3)^{th}$ row of each of the second and third display element regions may be connected to an odd-numbered pixel circuit formed in the $4n^{th}$ row and the (4n−3)$^{th}$ row of the second pixel circuit region, and an even-numbered display element formed in a (4n−1)$^{th}$ row and a (4n−2)$^{th}$ row of each of the second and third display element regions may be connected to an even-numbered pixel circuit formed in the 4n$^{th}$ row and the (4n−3)$^{th}$ row of the second pixel circuit region.

According to the embodiments described hereinbelow, a current supplied to each of the display elements formed in the second and third display element regions may be increased more as compared with a current supplied to each of the display elements formed in the first display element region. Therefore, even when the display elements are distributed from the second display element region to the third display element region in order to expand a display region by reducing a non-display region, a decrease in a luminance that may be caused by a decrease in a pixel density may be prevented.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
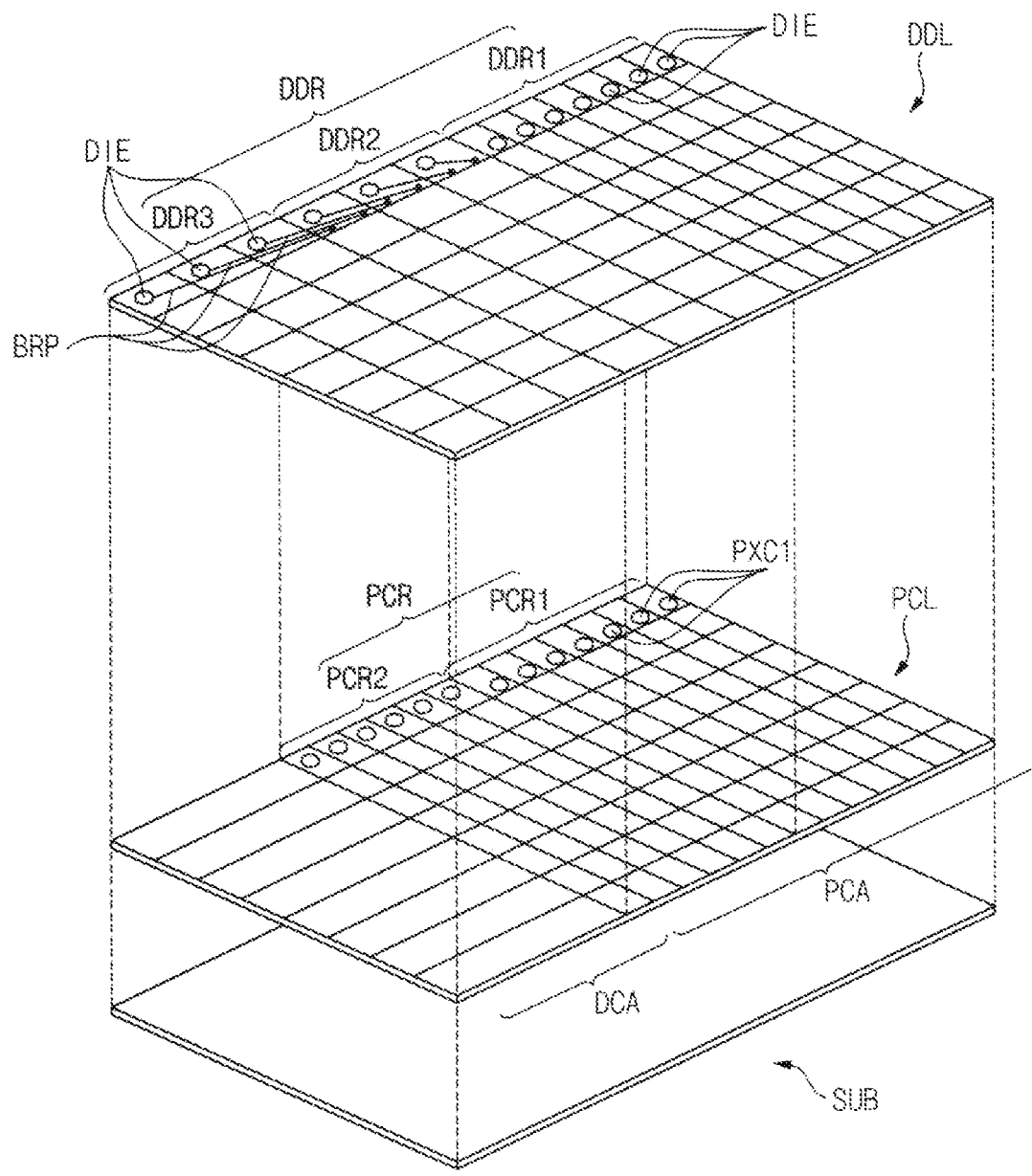
FIG. 1 is a perspective view for schematically describing a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis and the D2-axis are not limited to two axes of a rectangular, three-axis coordinate system, such as the x and y axes of an x, y, z three-axis coordinate system, and may be interpreted in a broader sense. For example, the D1-axis and the D2-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
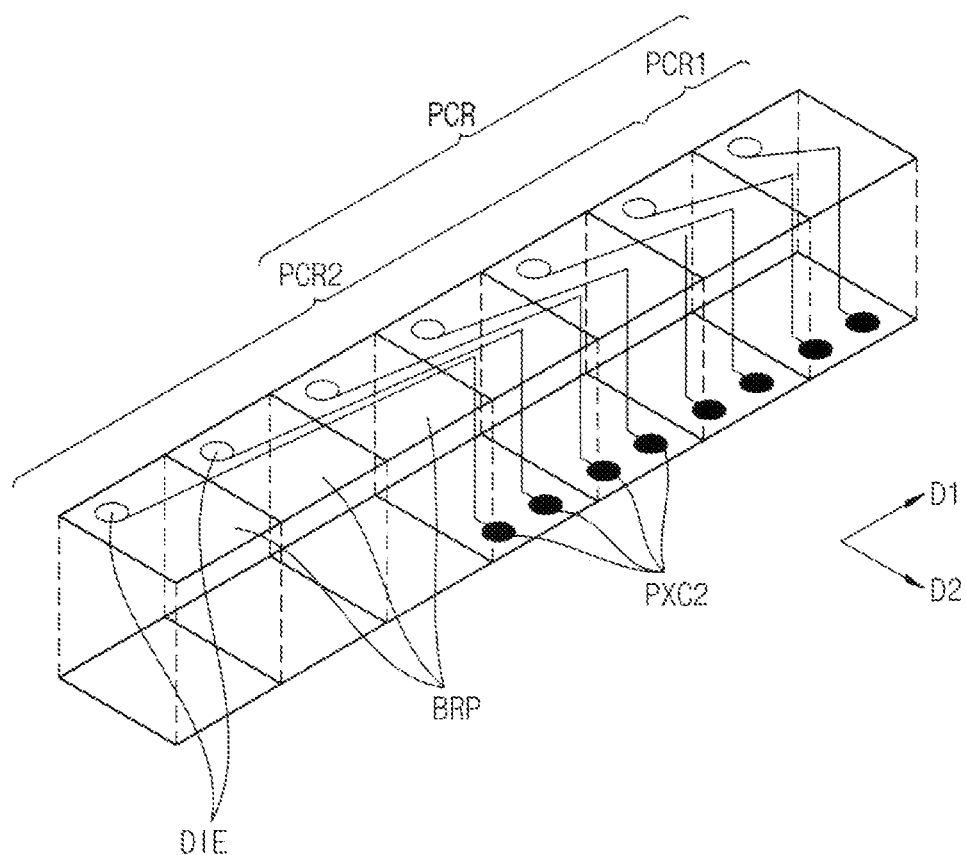
FIG. 2 is a perspective view for schematically describing a connection between a pixel circuit and a display device, which are formed in mutually different layers, through a bridge pattern shown in FIG. 1.
Figure 3:
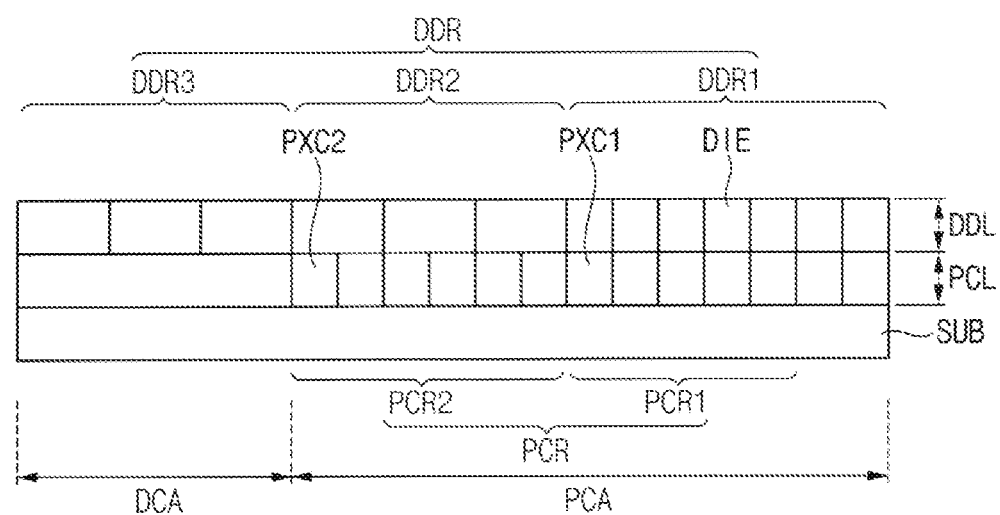
FIG. 3 is a sectional view for schematically describing the display device shown in FIG. 1.

FIG. 1 is a perspective view for schematically describing a display device according to an embodiment that is constructed according to principles of the invention. FIG. 2 is a perspective view for schematically describing a connection between a pixel circuit and a display device, which are formed in mutually different layers, through a bridge pattern shown in FIG. 1. FIG. 3 is a sectional view for schematically describing the display device shown in FIG. 1. For convenience of description, FIG. 1 shows only a connection relation between pixel circuits of a circuit layer and display elements of a display layer in a first pixel row.

Referring to FIGS. 1, 2, and 3, according to an embodiment, a display device may include a substrate SUB, a circuit layer PCL disposed on the substrate SUB, and a display layer DDL disposed on the circuit layer PCL.

The substrate SUB may have a closed curve shape. For example, the substrate SUB may be provided in various shapes such as a polygon, a circle, a semicircle, an ellipse, and a semi-ellipse. According to an embodiment, for convenience of description, the substrate SUB will be described as having a rectangular shape for illustrative purposes.

The circuit layer PCL may include a pixel circuit part PCA and a driving circuit part DCA that is adjacent to the pixel circuit part PCA.

The pixel circuit part PCA may include a plurality of pixel circuit regions PCR. A plurality of pixel circuits PXC1 and PXC2 connected to display elements DIE of the display layer DDL may be disposed in the pixel circuit regions PCR.

The pixel circuit region PCR may be arranged in a matrix form including rows extending in a first direction D1 and columns extending in a second direction D2 intersecting the first direction D1. However, an arrangement form of the pixel circuit region PCR is not particularly limited, and the pixel circuit region PCR may be arranged in various forms. For example, the rows and the columns may intersect with each other in an oblique direction without being orthogonal to each other.

The pixel circuit region PCR may include a first pixel circuit region PCR1 and a second pixel circuit region PCR2 that is adjacent to the driving circuit part DCA. Pixel circuits disposed in the first pixel circuit region PCR1 may be first pixel circuits PXC1, and pixel circuits disposed in the second pixel circuit region PCR2 may be second pixel circuits PXC2.

The driving circuit part DCA may be adjacent to the pixel circuit part PCA. For example, the driving circuit part DCA may make contact with at least one side of the pixel circuit part PCA.

The driving circuit part DCA may be provided with a driving part configured to drive the display elements DIE and wires. The driving part may provide signals to the pixel circuits through the wires, respectively, and the pixel circuits may control driving of the display elements DIE.

The driving part may include: a scan driver configured to provide scan signals to the pixel circuits through scan lines; an emission driver configured to provide emission control signals to the pixel circuits through emission control lines; and a data driver configured to provide data signals to the pixel circuits through data lines.

The display layer DDL may be configured to cover an entire area of the pixel circuit part PCA and a partial area of the driving circuit part DCA. The display layer DDL may include a plurality of display element regions DDR in which the display elements DIE are disposed, respectively. In this case, the display element regions DDR may be in one-to-one correspondence with the pixel circuit regions PCR.

The display element regions DDR may include: a first display element region DDR1 disposed on the first pixel circuit region PCR1; a second display element region DDR2 disposed on the second pixel circuit region PCR2; and a third display element region DDR3 disposed on the driving circuit part DCA.

The second display element region DDR2 and the third display element region DDR3 may be connected to the pixel circuits PXC2 of the second pixel circuit region PCR2. In this case, the second display element region DDR2 disposed on the pixel circuit part PCA may overlap the second pixel circuit region PCR2 corresponding thereto. The third display element region DDR3 disposed on the driving circuit part DCA may be spaced apart from the second pixel circuit region PCR2 corresponding thereto. An area of the second display element region DDR2 may be equal to an area of the third display element region DDR3.

The display elements DIE may be connected to the pixel circuits, respectively. The display elements DIE may be one of a liquid crystal display element (LCD element), an electrophoretic display element (EPD element), an electrowetting display element (EWD element), and an organic light emitting display element (OLED element). For convenience of description, the organic light emitting display element will be described below as one example of the display elements DIE.

The display elements DIE may include an anode electrode, a light emitting layer, and a cathode electrode. The light emitting layer may be disposed between the anode electrode and the cathode electrode. Electrons and holes injected through the anode electrode and the cathode electrode may be recombined in the light emitting layer to form excitons, and the exciton may emit energy while transitioning to a ground state. The energy may be emitted in a form of light.

The display layer DDL may extend to the driving circuit part DCA of the circuit layer PCL. In other words, a portion of the display element region DDR may overlap the driving circuit part DCA, and the display elements DIE provided in the display element region DDR overlapping the driving circuit part DCA may be disposed on the driving circuit part DCA.

The display elements DIE may be electrically connected to the pixel circuits through bridge patterns BRP. In this case, lengths of the bridge patterns BRP configured to connect the pixel circuits disposed in the second pixel circuit region PCR2 to the display elements DIE formed in the second display element region DDR2 may be longer than lengths of the bridge patterns BRP configured to connect the pixel circuits disposed in the second pixel circuit region PCR2 to the display elements DIE formed in the third display element region DDR3. According to the embodiment described herein, the bridge patterns BRP may be anode electrodes provided in the display elements DIE. According to the embodiment described herein, the bridge pattern BRP may be formed of a transparent material having conductivity. Transparent conductive oxide (TCO) may be used as the transparent material having conductivity. Indium oxide-tin oxide (indium tin oxide; ITO), indium oxide-zinc oxide (indium zinc oxide; IZO), antimony tin oxide (ATO), antimony zinc oxide (AZO), zinc oxide (ZnO), or the like may be used as the transparent conductive oxide (TCO).

Figure 4:
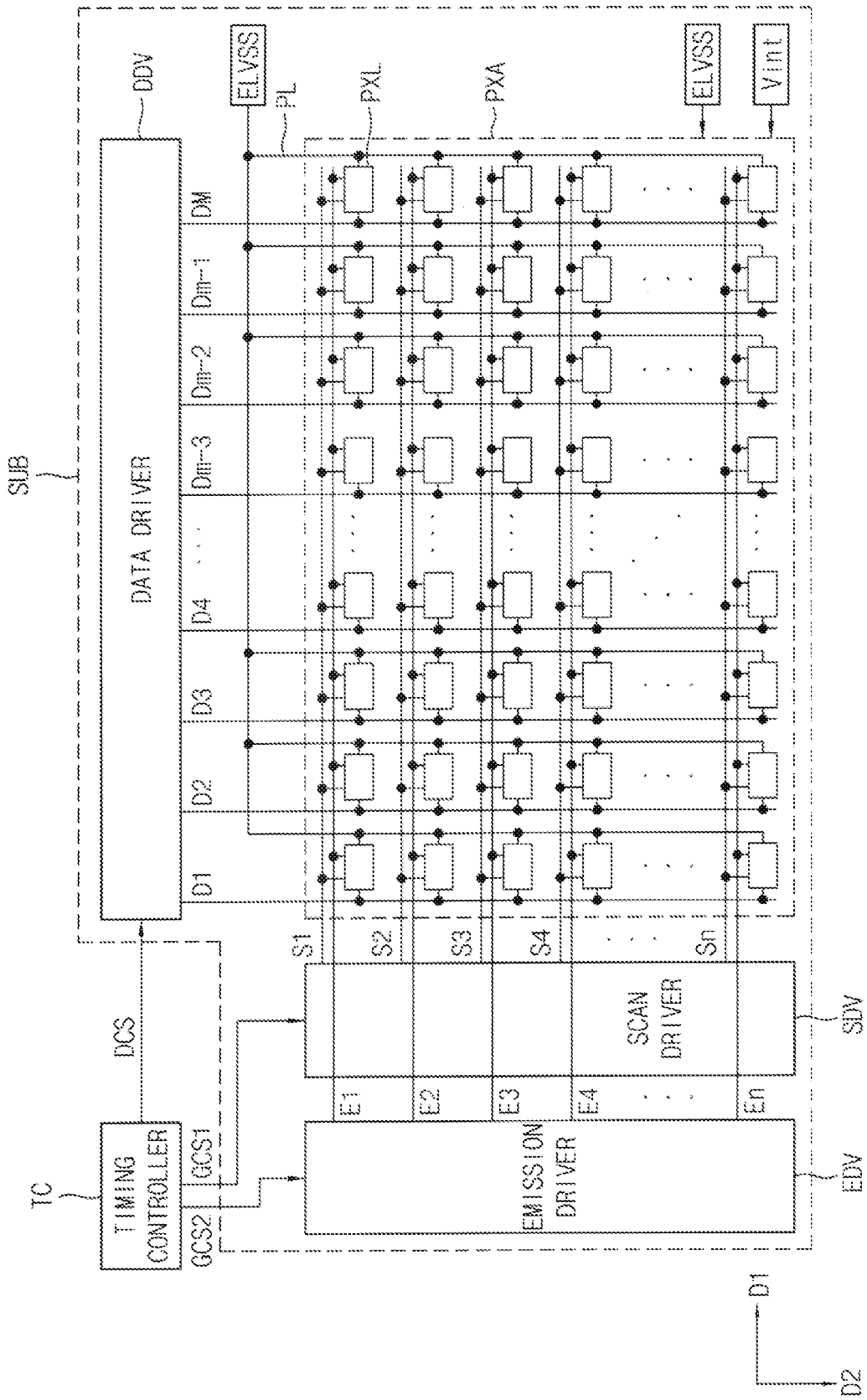
FIG. 4 is a block diagram showing an embodiment of pixels and a driving part of the display device shown in FIG. 1.

FIG. 4 is a block diagram showing an embodiment of pixels and a driving part of the display device shown in FIG. 1. In FIG. 4, a pixel refers to a combination of the pixel circuit and the display element of FIGS. 1 to 3.

Referring to FIG. 4, the display device may include a plurality of pixels PXL, a driving part, and a wire part.

The pixels PXL may be arranged in a matrix type.

The driving part may include a scan driver SDV, an emission driver EDV, a data driver DDV, and a timing controller TC. In FIG. 4, positions of the scan driver SDV, the emission driver EDV, the data driver DDV, and the timing controller TC have been set for convenience of description, so other positions within the display device may be adopted when the display device is actually implemented. For example, the scan driver SDV, the emission driver EDV, the data driver DDV, and the timing controller TC may be disposed on a lower side of a region in which the pixels PXL are disposed.

The wirer part may provide a signal from the driving part to each of the pixels PXL, and may include scan lines S1 to Sn, data lines D1 to Dm, emission control lines E1 to En, a power supply line PL, and an initialization power supply line.

The pixels PXL may be disposed in a pixel region PXA. The pixels PXL may be connected to the scan lines S1 to Sn, the emission control lines E1 to En, and the data lines D1 to Dm. The pixels PXL may receive data signals from the data lines D1 to Dm when scan signals are supplied from the scan lines S1 to Sn. The pixels PXL that have received the data signals may control an amount of a current flowing from a first power supply ELVDD to a second power supply ELVSS via a display element.

The scan driver SDV may supply the scan signals to the scan lines S1 to Sn in response to a first gate control signal GCS1 from the timing controller TC. For example, the scan driver SDV may sequentially supply the scan signals to the scan lines S1 to Sn. When the scan signals are sequentially supplied to the scan lines S1 to Sn, the pixels PXL may be sequentially selected in a unit of a horizontal line.

The emission driver EDV may supply emission control signals to the emission control lines E1 to En in response to a second gate control signal GCS2 from the timing controller TC. For example, the emission driver EDV may sequentially supply the emission control signals to the emission control lines E1 to En. In this case, the emission control signal may be set to have a wider width than the scan signal. For example, an emission control signal supplied to an $i^{th}$ emission control line Ei (i is a positive integer greater than or equal to one) may be supplied to overlap a scan signal supplied to an $(i-1)^{th}$ scan line Si-1 and a scan signal supplied to an $i^{th}$ scan line Si for at least a partial period.

In addition, the emission control signal may be set to a gate-off voltage (e.g., a high voltage) that allows a thin film transistor included in the pixels PXL to be turned off. Further, the scan signal may be set to a gate-on voltage (e.g., a low voltage) that allows the thin film transistor included in the pixels PXL to be turned on.

The data driver DDV may supply the data signals to the data lines D1 to Dm in response to a data control signal DCS. The data signals supplied to the data lines D1 to Dm may be supplied to the pixels PXL selected by the scan signals.

The timing controller TC may supply the first and second gate control signals GCS1 and GCS2 generated based on timing signals supplied from an external device to each of the scan driver SDV and the emission driver EDV, and supply the data control signal DCS to the data driver DDV. Each of the first and second gate control signals GCS1 and GCS2 may include a start pulse and clock signals. The start pulse may control timing of a first scan signal or a first emission control signal. The clock signals may be used to shift the start pulse. The data control signal DCS may include a source start pulse and clock signals. The source start pulse may control a data sampling start time. The clock signals may be used to control a sampling operation.

Figure 5:
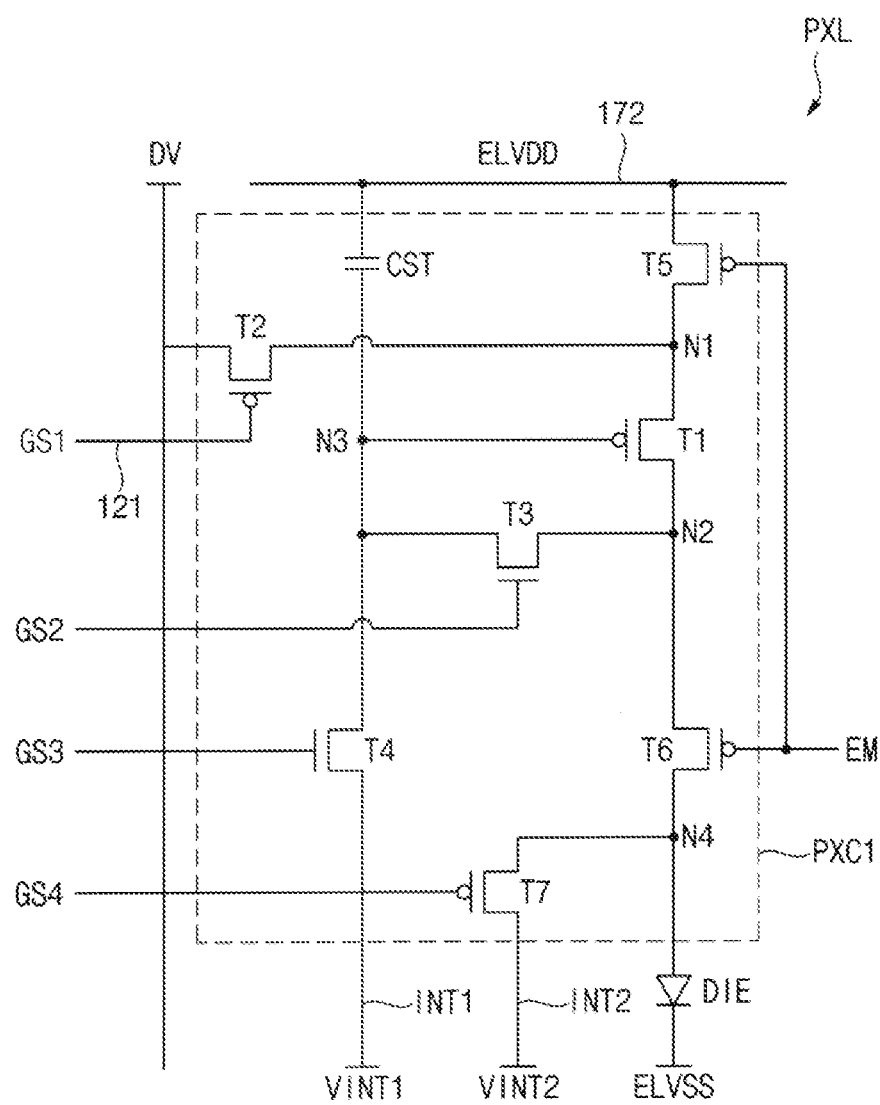
FIG. 5 is an equivalent circuit diagram for describing one example of the pixel shown in FIGS. 1 to 4.

FIG. 5 is an equivalent circuit diagram for describing one example of the pixel PXL shown in FIGS. 1 to 4.

Referring to FIG. 5, according to an embodiment, the pixel PXL may include the first pixel circuit PXC1 and the display element DIE, or may include the second pixel circuit PXC2 and the display element DIE, which are shown in FIGS. 1 to 4. According to the embodiment described herein, the display element DIE may emit light based on a driving current provided from the first pixel circuit PXC1 or the second pixel circuit PXC2. The display element DIE may include an organic light emitting diode (OLED) or a nano-diode.

The pixel PXL may include a driving transistor T1, a switching transistor T2, a compensation transistor T3, a first initialization transistor T4, a first emission control transistor T5, a second emission control transistor T6, a second initialization transistor T7, a storage capacitor C1, and a boost capacitor C2, but the embodiment described herein is not limited thereto. According to another embodiment, the pixel PXL may include two to six transistors or eight or more transistors, and/or one capacitor or three or more capacitors.

The driving transistor T1 may be connected between a first node N1 and a second node N2. A gate electrode of the driving transistor T1 may be connected to a third node N3. The driving transistor T1 may generate the driving current based on a voltage between the first node N1 and the third node N3.

The switching transistor T2 may be connected between a data line DL and the first node N1. A gate electrode of the switching transistor T2 may receive a first gate signal GS1 from a scan line 121. The switching transistor T2 may receive a data voltage DV from the data line DL, and transmit the data voltage DV to the first node N1 based on the first gate signal GS1.

The compensation transistor T3 may be connected between the second node N2 and the third node N3. A gate electrode of the compensation transistor T3 may receive a second gate signal GS2. The compensation transistor T3 may compensate for a threshold voltage of the driving transistor T1 by connecting the second node N2 to the third node N3 based on the second gate signal GS2.

The first initialization transistor T4 may be connected between a first initialization voltage line INT1 and the third node N3. A gate electrode of the first initialization transistor T4 may receive a third gate signal GS3. According to one embodiment, when the pixel PXL is included in an $N^{th}$ pixel row, the third gate signal GS3 may be a first gate signal applied to an $(N-1)^{th}$ pixel row. The first initialization transistor T4 may initialize the gate electrode of the driving transistor T1 by receiving a first initialization voltage VINT1 from the first initialization voltage line INT1 and transmitting the first initialization voltage VINT1 to the third node N3 based on the third gate signal GS3.

The first emission control transistor T5 may be connected between a power supply voltage line 172 and the first node N1. A gate electrode of the first emission control transistor T5 may receive an emission control signal EM. The power supply voltage line 172 may transmit a first power supply voltage ELVDD from a first power supply.

The second emission control transistor T6 may be connected between the second node N2 and a fourth node N4. A gate electrode of the second emission control transistor T6 may receive the emission control signal EM. The first emission control transistor T5 and the second emission control transistor T6 may transmit the driving current generated by the driving transistor T1 to the display element DIE based on the emission control signal EM.

The second initialization transistor T7 may be connected between a second initialization voltage line INT2 and the fourth node N4. A gate electrode of the second initialization transistor T7 may receive a fourth gate signal GS4. According to one embodiment, when the pixel PXL is included in the $N^{th}$ pixel row, the fourth gate signal GS4 may be a first gate signal applied to an $(N+1)^{th}$ pixel row. The second initialization transistor T7 may initialize the display element DIE by receiving a second initialization voltage VINT2 from the second initialization voltage line INT2 and transmitting the second initialization voltage VINT2 to the fourth node N4 based on the fourth gate signal GS4.

According to one embodiment, each of the driving transistor T1, the switching transistor T2, the first emission control transistor T5, the second emission control transistor T6, and the second initialization transistor T7 may be a transistor having a single gate structure, and each of the compensation transistor T3 and the first initialization transistor T4 may be a transistor having a dual gate structure. In this case, the gate electrode of each of the compensation transistor T3 and the first initialization transistor T4 may include a lower gate electrode and an upper gate electrode, and the lower gate electrode and the upper gate electrode may be electrically connected to each other.

According to one embodiment, each of the driving transistor T1, the switching transistor T2, the first emission control transistor T5, the second emission control transistor T6, and the second initialization transistor T7 may include a polycrystalline silicon pattern, and each of the compensation transistor T3 and the first initialization transistor T4 may include an oxide semiconductor pattern. According to one embodiment, each of the driving transistor T1, the switching transistor T2, the first emission control transistor T5, the second emission control transistor T6, and the second initialization transistor T7 may be a PMOS, and each of the compensation transistor T3 and the first initialization transistor T4 may be an NMOS.

The storage capacitor C1 may be connected between the power supply voltage line 172 and the third node N3. The storage capacitor C1 may maintain the voltage between the first node N1 and the third node N3 even when the switching transistor T2 is turned off, so that the display element DIE may emit light.

The boost capacitor C2 may be connected between the scan line 121 and the third node N3. The boost capacitor C2 may boost a voltage level of the gate electrode of the driving transistor T1.

An anode electrode of the display element DIE may be connected to the driving transistor T1 via the second emission control transistor T6, and a cathode electrode of the display element DIE may be connected to a second power supply ELVSS. The display element DIE may generate light having a predetermined luminance in response to the amount of the current supplied from the driving transistor T1. The first power supply ELVDD may be set to be a higher voltage than the second power supply ELVSS so that the current may flow through the display element DIE.

Figure 6:
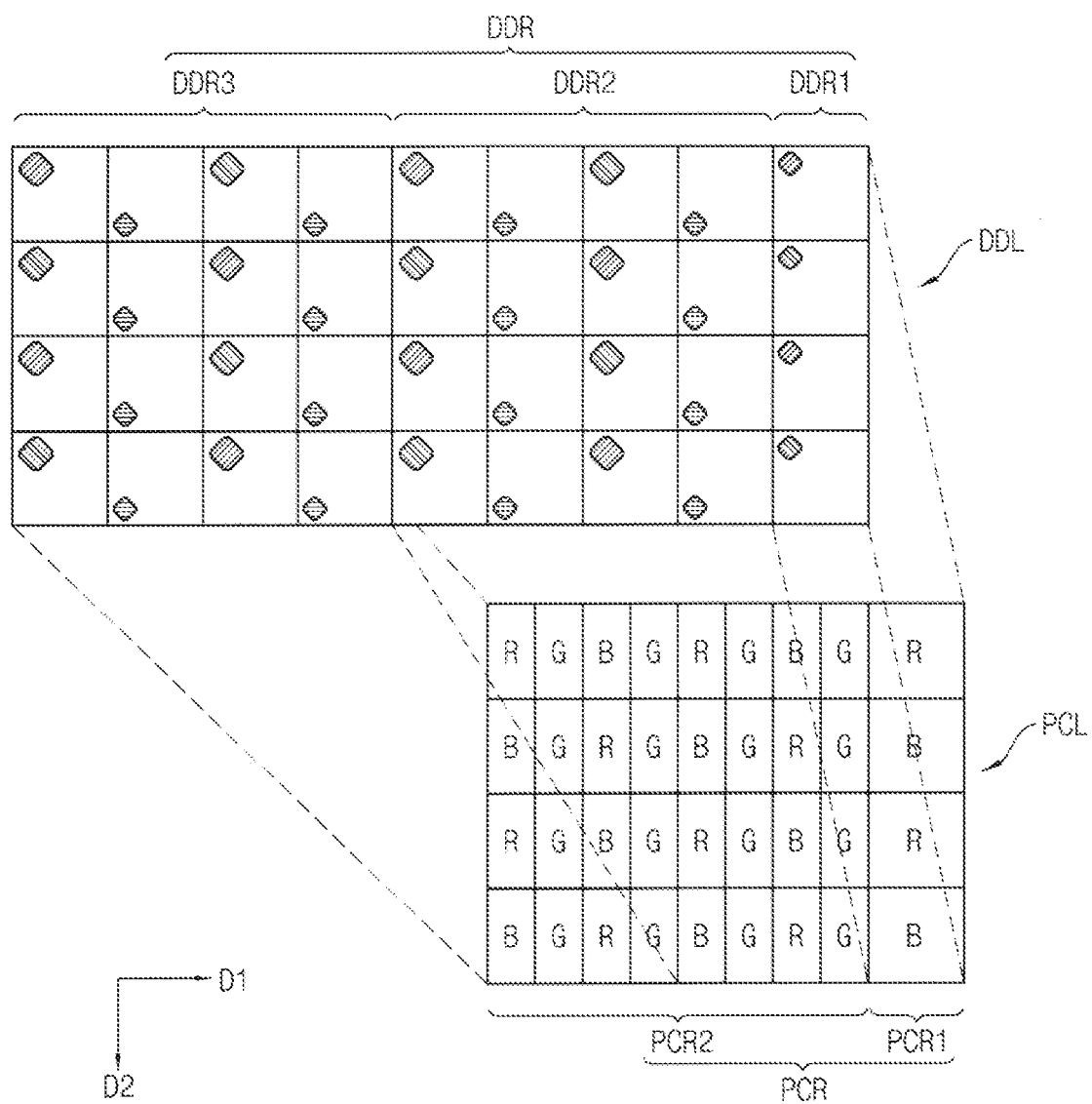
FIG. 6 is a view for schematically describing a display device according to a first embodiment.

FIG. 6 is a view for schematically describing a display device according to a first embodiment. In particular, an example where display elements are distributed in each of the second display element region DDR2 and the third display element region DDR3 to correspond to the second pixel circuit region PCR2 has been shown. For convenience of description, only the circuit layer PCL and the display layer DDL disposed on the circuit layer PCL, which are provided in the display device, have been shown.

Referring to FIGS. 1 and 6, the circuit layer PCL disposed on a lower side may include a pixel circuit part PCA and a driving circuit part DCA. The pixel circuit part PCA may include a plurality of pixel circuit regions PCR.

The pixel circuit region PCR may include a first pixel circuit region PCR1 and a second pixel circuit region PCR2 that is adjacent to the driving circuit part DCA. Unit pixel regions, each having a first area, may be formed in the first pixel circuit region PCR1, and unit pixel regions, each having a second area that is smaller than the first area, may be formed in the second pixel circuit region PCR2.

A plurality of sub-pixel regions may be formed in each of the unit pixel regions. For example, the sub-pixel region may be provided with a pixel circuit of a red sub-pixel configured to emit red light, a pixel circuit of a green sub-pixel configured to emit green light, and a pixel circuit of a blue sub-pixel configured to emit blue light.

According to the embodiment described herein, the second area may correspond to ½ of the first area. Therefore, a density of the pixel circuits formed in the second pixel circuit region PCR2 may be two times greater than a density of the pixel circuits formed in the first pixel circuit region PCR1.

The display layer DDL disposed on an upper side may include a first display element region DDR1 disposed on the first pixel circuit region PCR1, a second display element region DDR2 disposed on the second pixel circuit region PCR2, and a third display element region DDR3 disposed on the driving circuit part DCA. A total area corresponding to the second display element regions DDR2 and a total area corresponding to the third display element regions DDR3 may be equal to each other.

A pixel density of the second display element region DDR2 and a pixel density of the third display element region DDR3 per unit area may be equal to each other, and a pixel density of the first display element region DDR1 per unit area may be higher than the pixel density of the second display element region DDR2.

Substantially, while sub-pixel sizes of the first, second, and third display element regions DDR1, DDR2, and DDR3 are equal to each other, the pixel density of the first display element region DDR1 may be two times higher than the pixel density of each of the second and third display element regions DDR2 and DDR3, so that a current supplied by the pixel circuit of the second and third display element regions DDR2 and DDR3 has to be higher than a current supplied by the pixel circuit of the first display element region DDR1. Accordingly, a size of the capacitor of the pixel circuit of the second and third display element regions DDR2 and DDR3 and a channel width W of the first thin film transistor T1 have to be increased.

In detail, the display element formed in the third display element region DDR3 may be driven by the pixel circuit formed in the second pixel circuit region PCR2. Each of the pixel circuits may include a plurality of thin film transistors and a storage capacitor. A driving transistor (or a first thin film transistor) (T1 of FIG. 5) among the thin film transistors may control an amount of a current flowing from a first power supply ELVDD to a second power supply ELVSS via a display element DIE.

Therefore, a channel width of the driving transistor formed in the second pixel circuit region PCR2 may be set to be greater than a channel width of the driving transistor formed in the first pixel circuit region PCR1. For example, when a channel width/channel length (W/L) of the driving transistor T1 formed in the first pixel circuit region PCR1 is 3/16, a W/L of the driving transistor T1 formed in the second pixel circuit region PCR2 may be set to be 6/16.

As described above, when a half of the display elements disposed in the second display element region DDR2 corresponding to a periphery of the first display element region DDR1 are moved to the third display element region DDR3, the pixel density of each of the second display element region DDR2 and the third display element region DDR3 may be decreased, so that a luminance may also be decreased.

Therefore, in order to compensate for the decreased luminance, the channel width of the driving transistor may be expanded in each of the pixel circuits configured to drive the display elements formed in each of the second display element region DDR2 and the third display element region DDR3.

Since the channel width of the driving transistor is expanded, the current passing through the display element DIE may be increased so that a luminance may be increased in each of the second display element region DDR2 and the third display element region DDR3.

Figure 7:
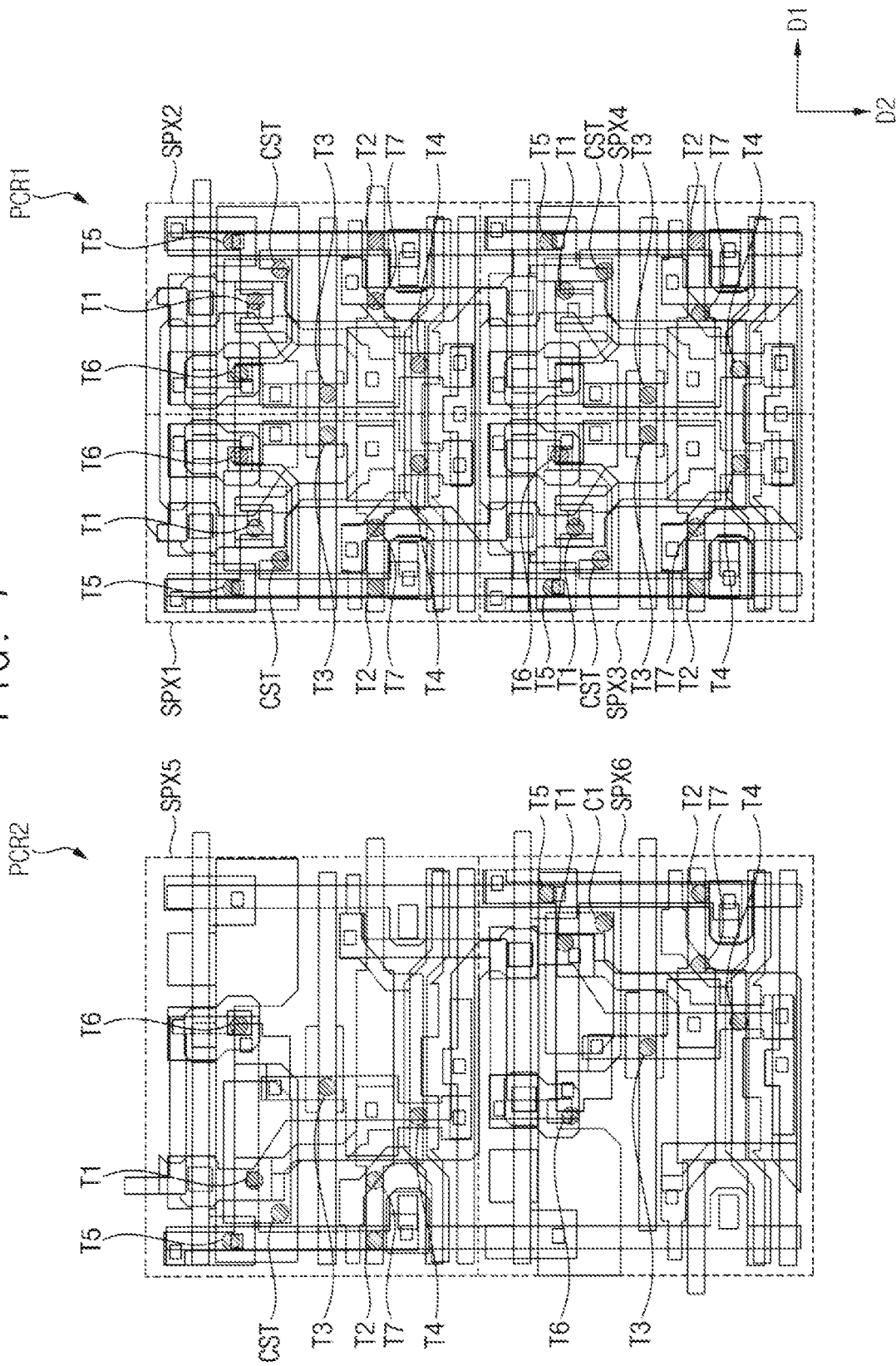
FIG. 7 is a plan view for describing first pixel circuits and second pixel circuits according to one or more embodiments.

FIG. 7 is a plan view for describing first pixel circuits PXC1 and second pixel circuits PXC2 according to an embodiment.

Referring to FIG. 7, the first pixel circuit region PCR1 in which the first pixel circuits PXC1 are formed has been shown on a right side, and the second pixel circuit region PCR2 in which the second pixel circuits PXC2 are formed has been shown on a left side.

The first pixel circuits PXC1 formed in the first pixel circuit region PCR1 may include: a first sub-pixel SPX1 disposed in a region of an odd-numbered row and an odd-numbered column; a second sub-pixel SPX2 disposed in a region of the odd-numbered row and an even-numbered column; a third sub-pixel SPX3 disposed in a region of an even-numbered row and the odd-numbered column; and a fourth sub-pixel SPX4 disposed in a region of the even-numbered row and the even-numbered column. In other words, in the first pixel circuit region PCR1, the first sub-pixel SPX1 may be formed in a fourth quadrant region, and the second sub-pixel SPX2 may be formed in a first quadrant region. In addition, in the first pixel circuit region PCR1, the third sub-pixel SPX3 may be formed in a third quadrant region, and the fourth sub-pixel SPX4 may be formed in a second quadrant region.

Each of the first to fourth sub-pixels SPX1, SPX2, SPX3, and SPX4 may include a driving transistor T1, a switching transistor T2, a compensation transistor T3, a first initialization transistor T4, a first emission control transistor T5, a second emission control transistor T6, a second initialization transistor T7, and a storage capacitor CST. The driving transistor T1, the switching transistor T2, the compensation transistor T3, the first initialization transistor T4, the first emission control transistor T5, the second emission control transistor T6, the second initialization transistor T7, and the storage capacitor CST formed in each of the first to fourth sub-pixels SPX1, SPX2, SPX3, and SPX4 will be described in detail below with reference to FIGS. 8 to 19.

The second pixel circuits PXC2 formed in the second pixel circuit region PCR2 may include: a fifth sub-pixel SPX5 disposed in a region of an odd-numbered row and an odd-numbered column; and a sixth sub-pixel SPX6 disposed in a region of an even-numbered row and an even-numbered column. However, in the second pixel circuit region PCR2, the fifth sub-pixel SPX5 may partially expand to a region of the odd-numbered row and the even-numbered column, and the sixth sub-pixel SPX6 may partially expand to a region of the even-numbered rows and the odd-numbered column. In other words, in the second pixel circuit region PCR2, some components of the fifth sub-pixel SPX5 may partially expand to a fourth quadrant region, and some components of the sixth sub-pixel SPX6 may partially expand to a second quadrant region.

Each of the fifth and sixth sub-pixels SPX5 and SPX6 may include a driving transistor T1, a switching transistor T2, a compensation transistor T3, a first initialization transistor T4, a first emission control transistor T5, a second emission control transistor T6, a second initialization transistor T7, and a storage capacitor CST. The driving transistor T1, the switching transistor T2, the compensation transistor T3, the first initialization transistor T4, the first emission control transistor T5, the second emission control transistor T6, the second initialization transistor T7, and the storage capacitor CST formed in each of the fifth and sixth sub-pixels SPX5 and SPX6 will be described in detail below with reference to FIGS. 8 to 19.

According to the embodiment described herein, a channel width of the driving transistor T1 corresponding to each of the fifth and sixth sub-pixels SPX5 and SPX6 may be greater than a channel width of the driving transistor T1 corresponding to the first sub-pixel SPX1. For example, the channel width of the driving transistor T1 corresponding to the fifth sub-pixel SPX5 may be two times the channel width of the driving transistor T1 corresponding to the first sub-pixel SPX1.

In addition, a size of the storage capacitor CST corresponding to each of the fifth and sixth sub-pixels SPX5 and SPX6 may be greater than a size of the storage capacitor CST corresponding to the first sub-pixel SPX1. For example, the size of the storage capacitor CST corresponding to the fifth sub-pixel SPX5 may be two times the size of the storage capacitor CST corresponding to the first sub-pixel SPX1.

According to the embodiment described herein, in order to expand the channel width of the driving transistor T1 corresponding to the fifth sub-pixel SPX5, an active layer may expand to a first quadrant region. In addition, the storage capacitor CST corresponding to the fifth sub-pixel SPX5 may expand to the first quadrant region.

According to the embodiment described herein, in order to expand the channel width of the driving transistor T1 corresponding to the sixth sub-pixel SPX6, an active layer may expand to a third quadrant region. In addition, the storage capacitor CST corresponding to the sixth sub-pixel SPX6 may expand to the third quadrant region.

FIGS. 8 to 19 are plan views for describing a method of manufacturing the first pixel circuits PXC1 and the second pixel circuits PXC2 shown in FIG. 7.

Figure 8:
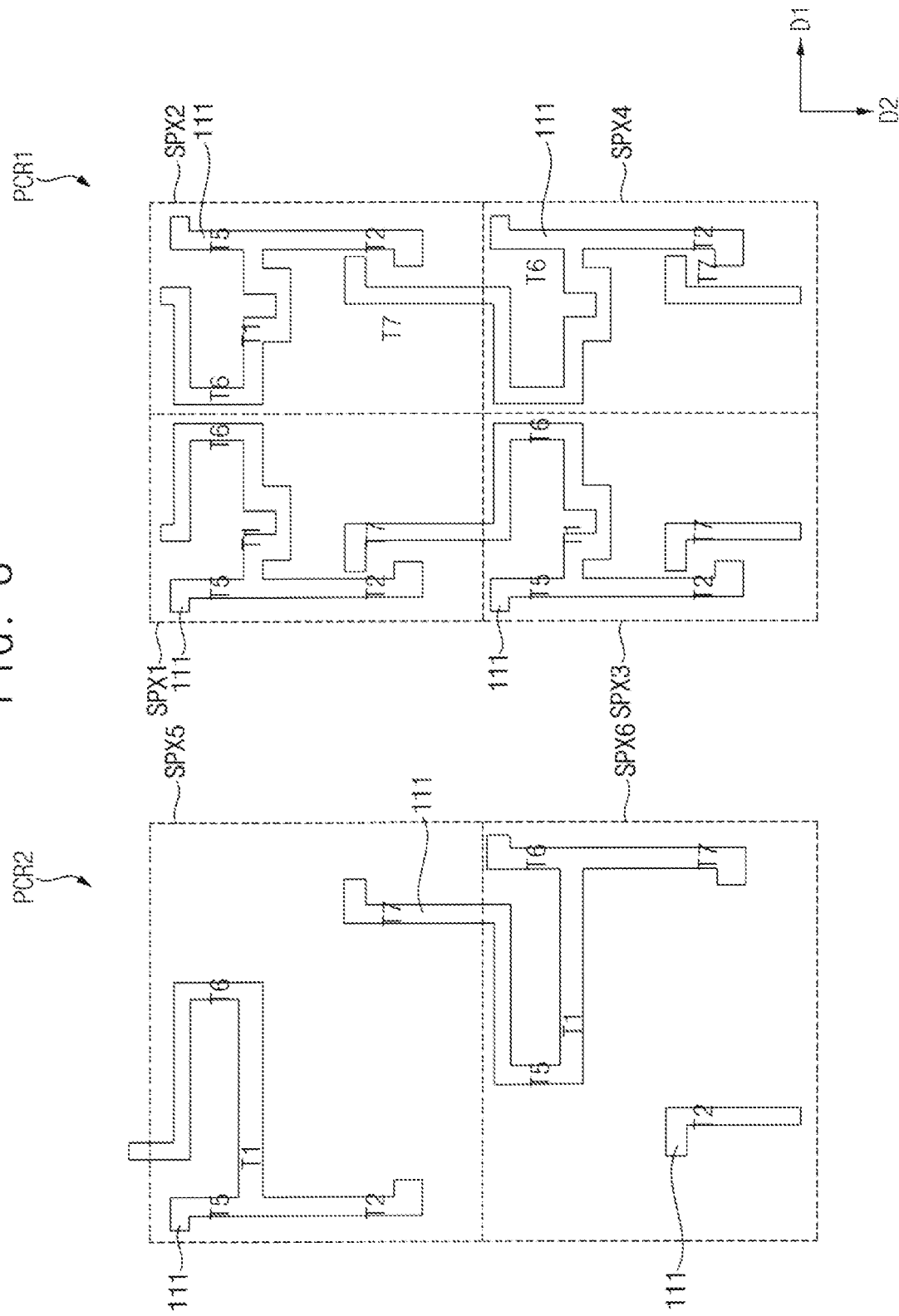
FIGS. 8, 9, 10, 11, 12, 13, 14, 15, 16, 17, 18, and 19 are plan views for describing a method of manufacturing the first pixel circuits and the second pixel circuits shown in FIG. 7.
Figure 9:
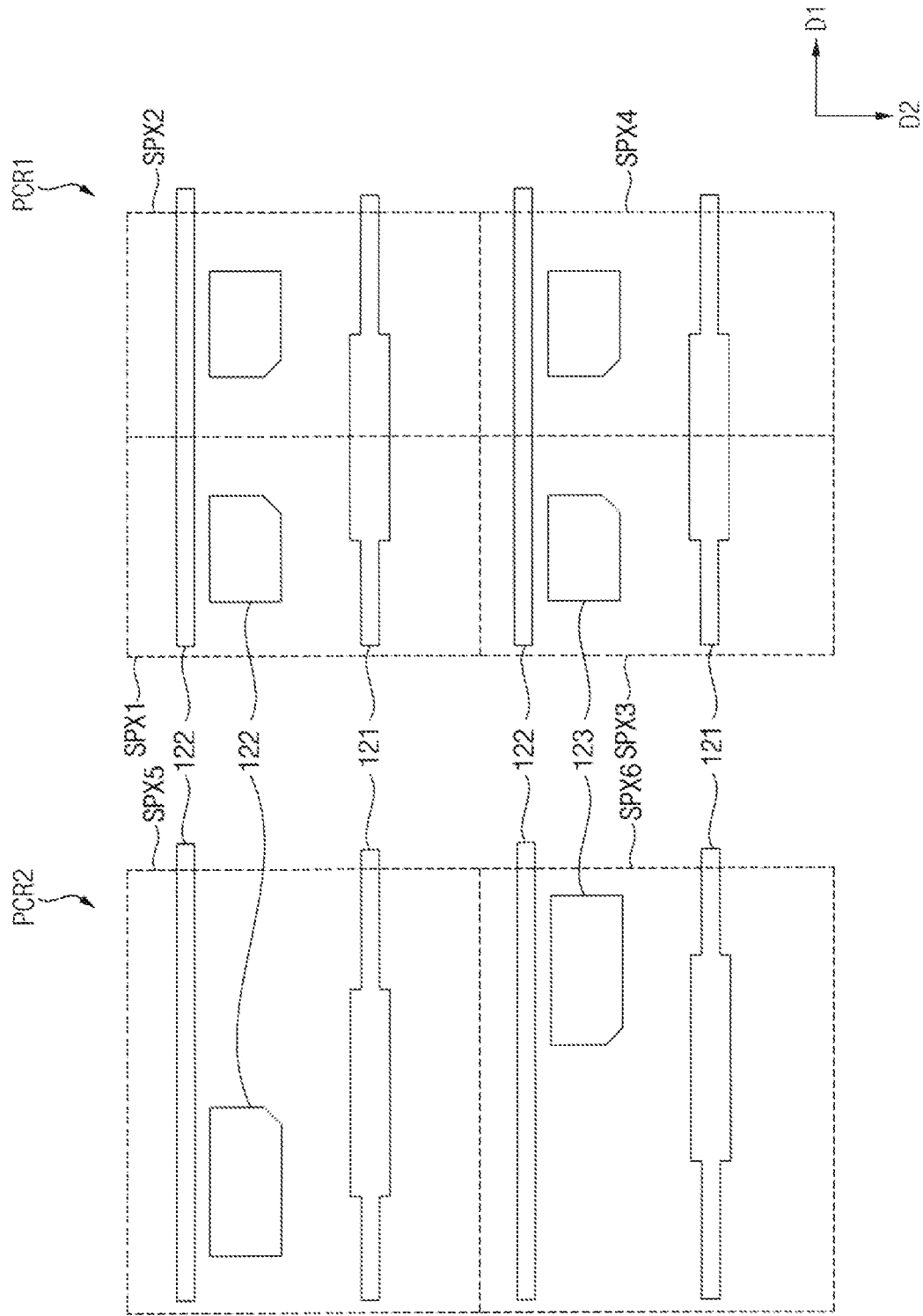
Figure 10:
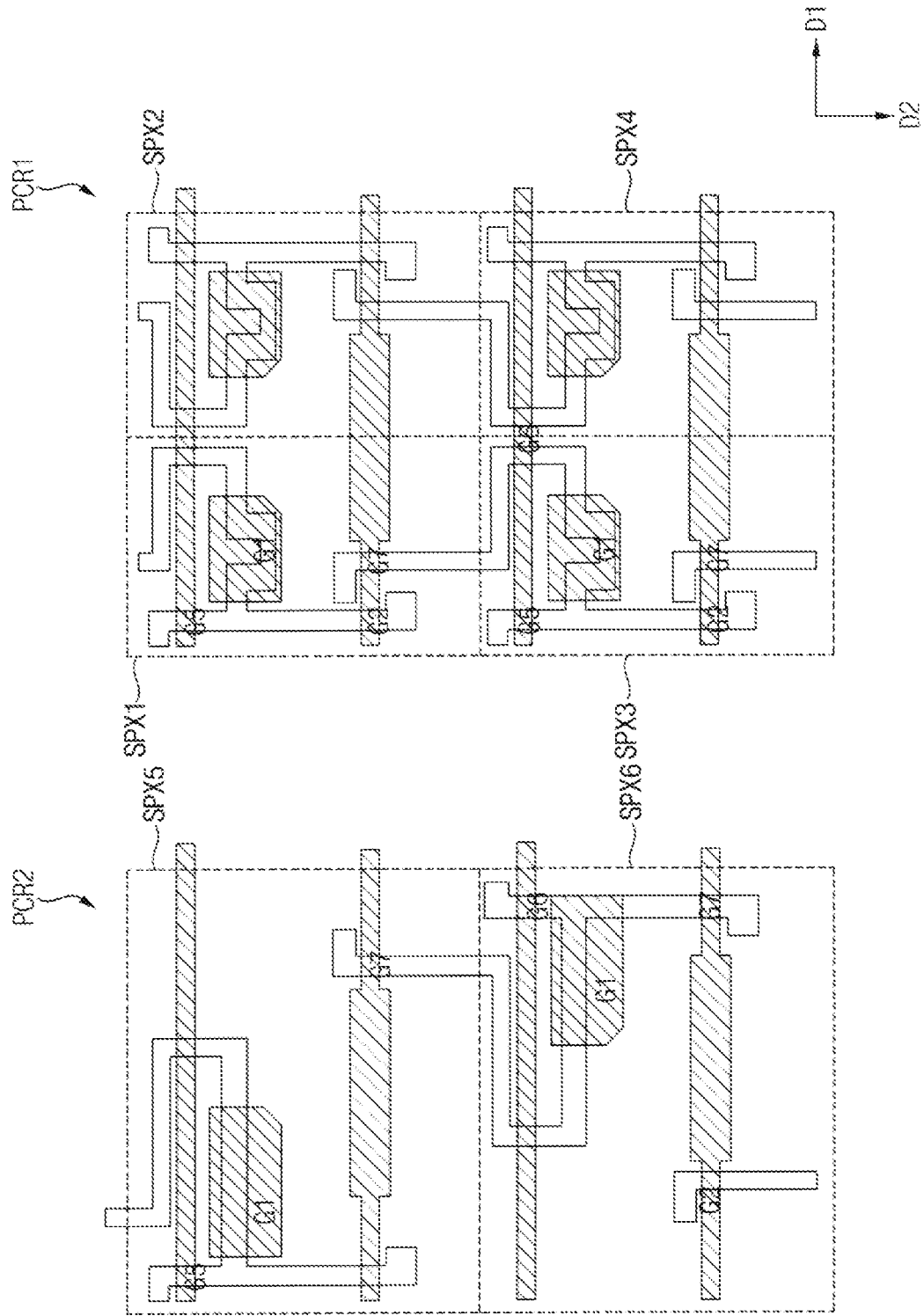
Figure 11:
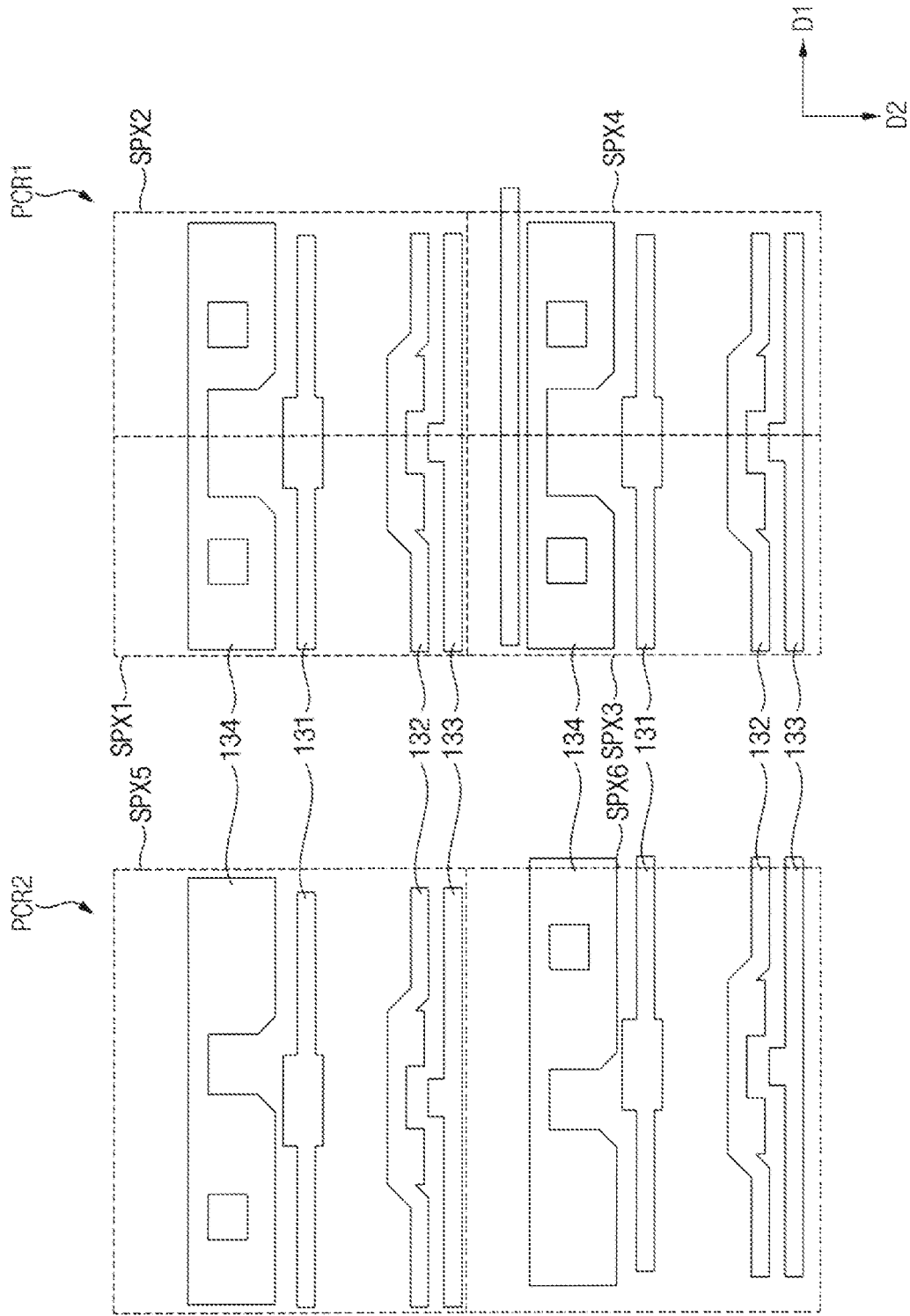
Figure 12:
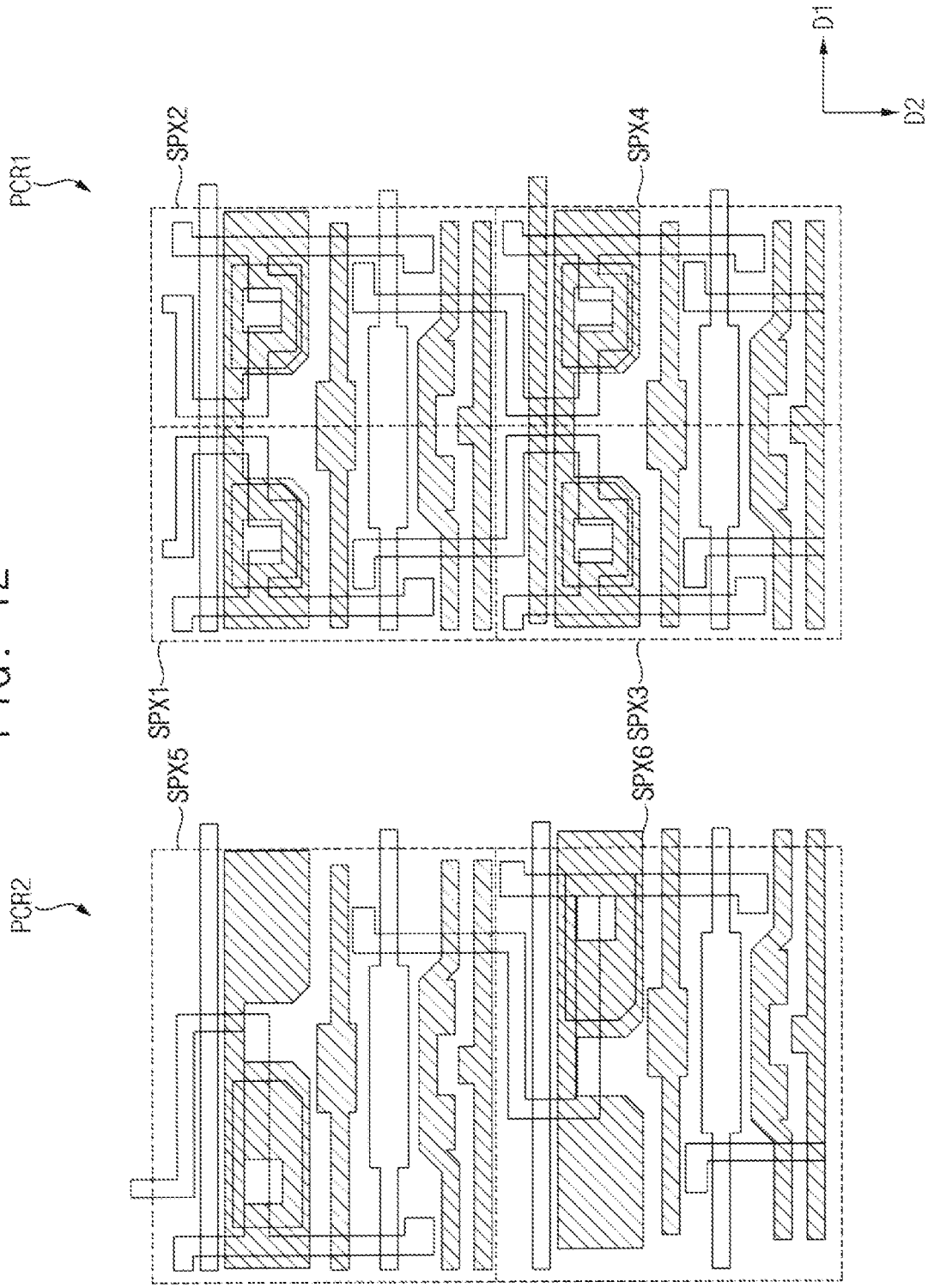
Figure 13:
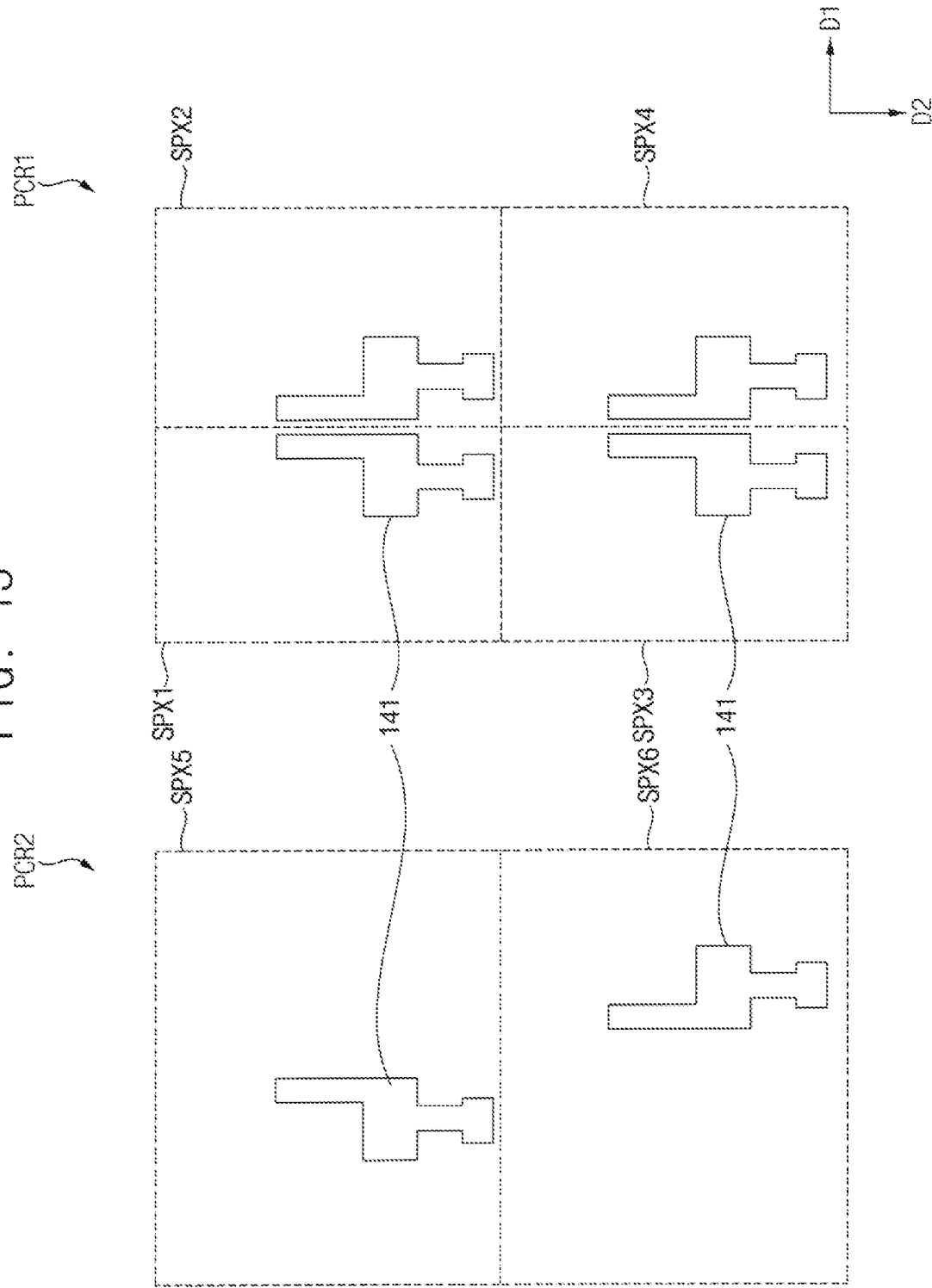
Figure 14:
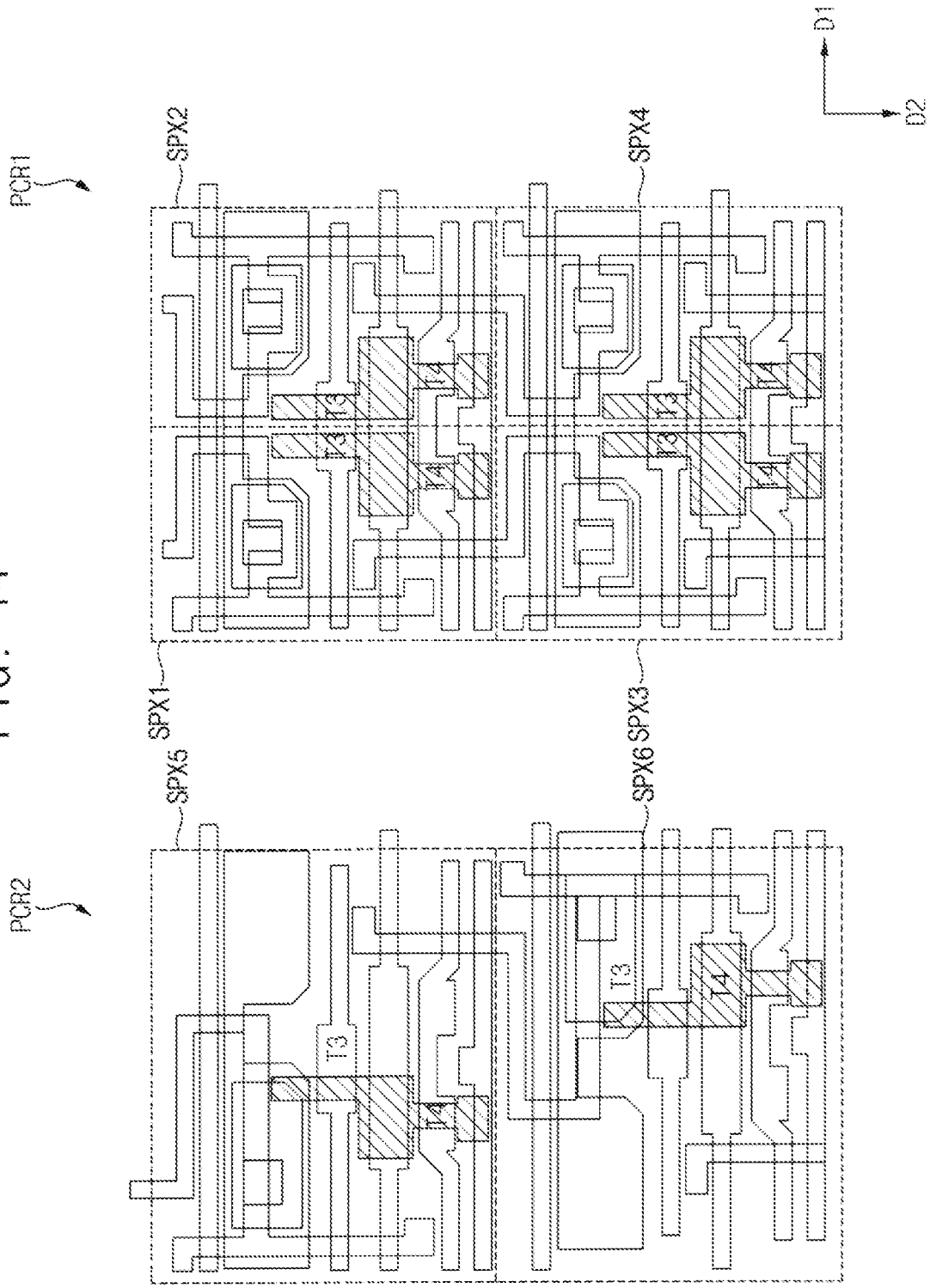
Figure 15:
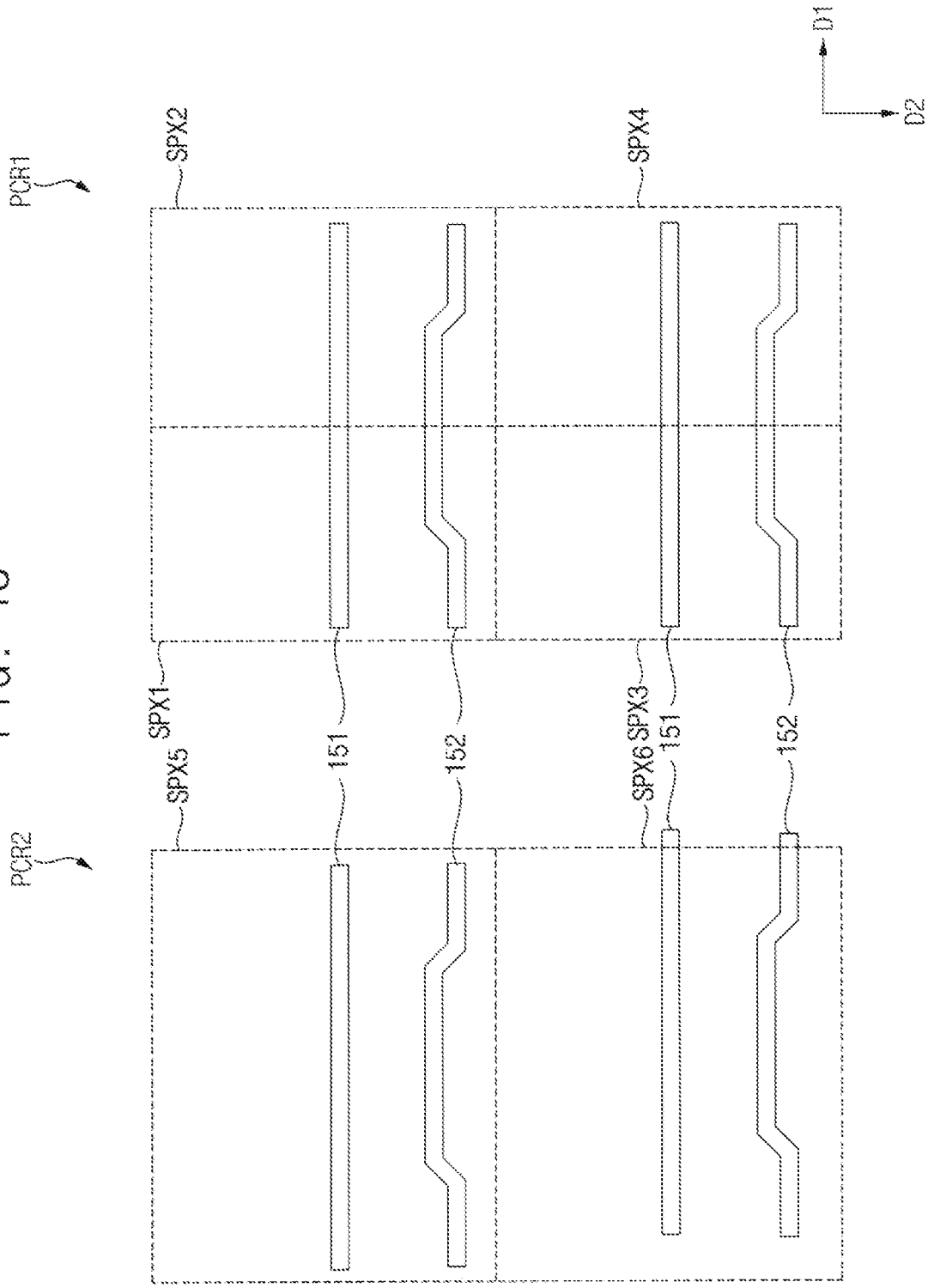
Figure 16:
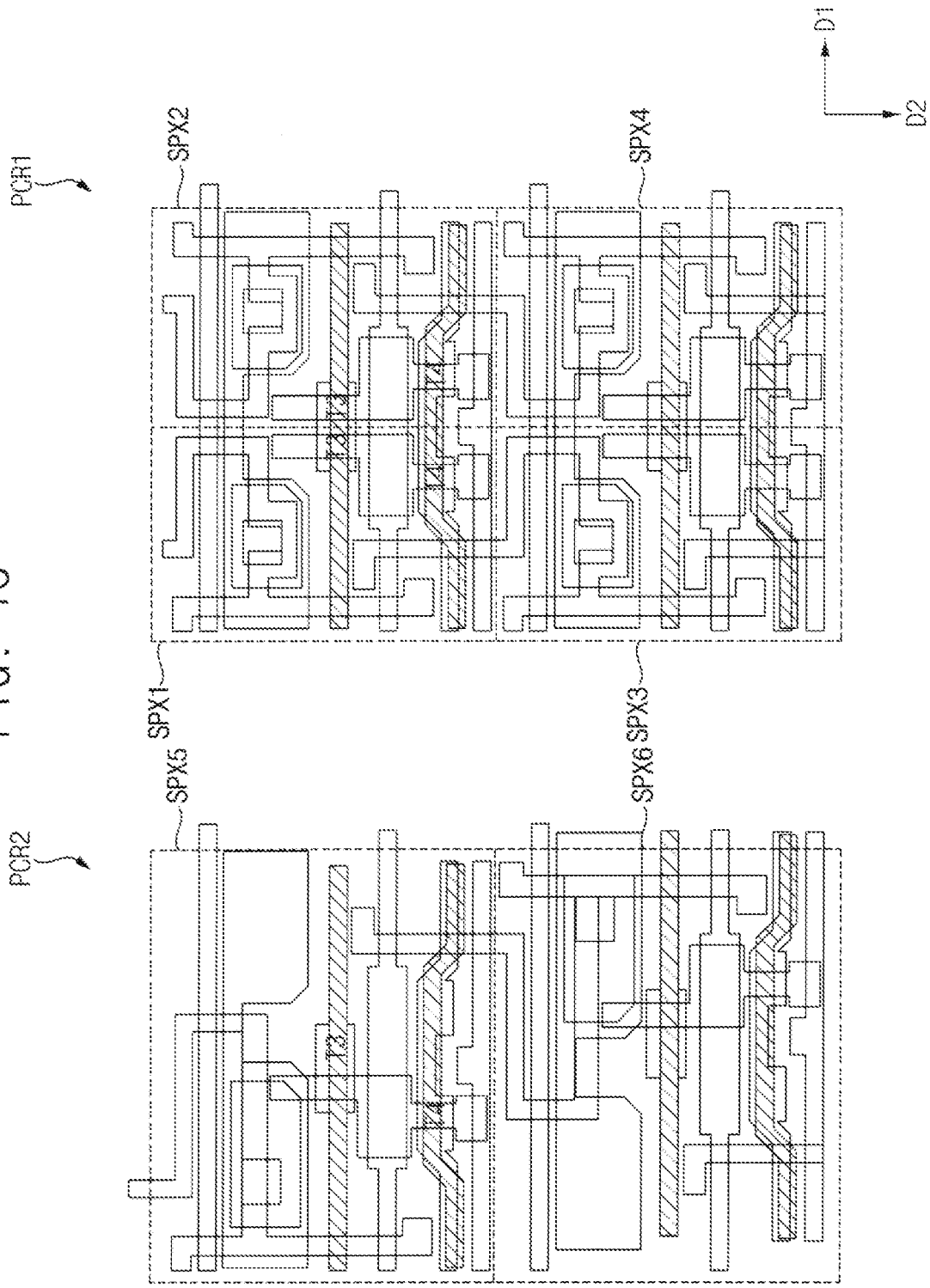
Figure 17:
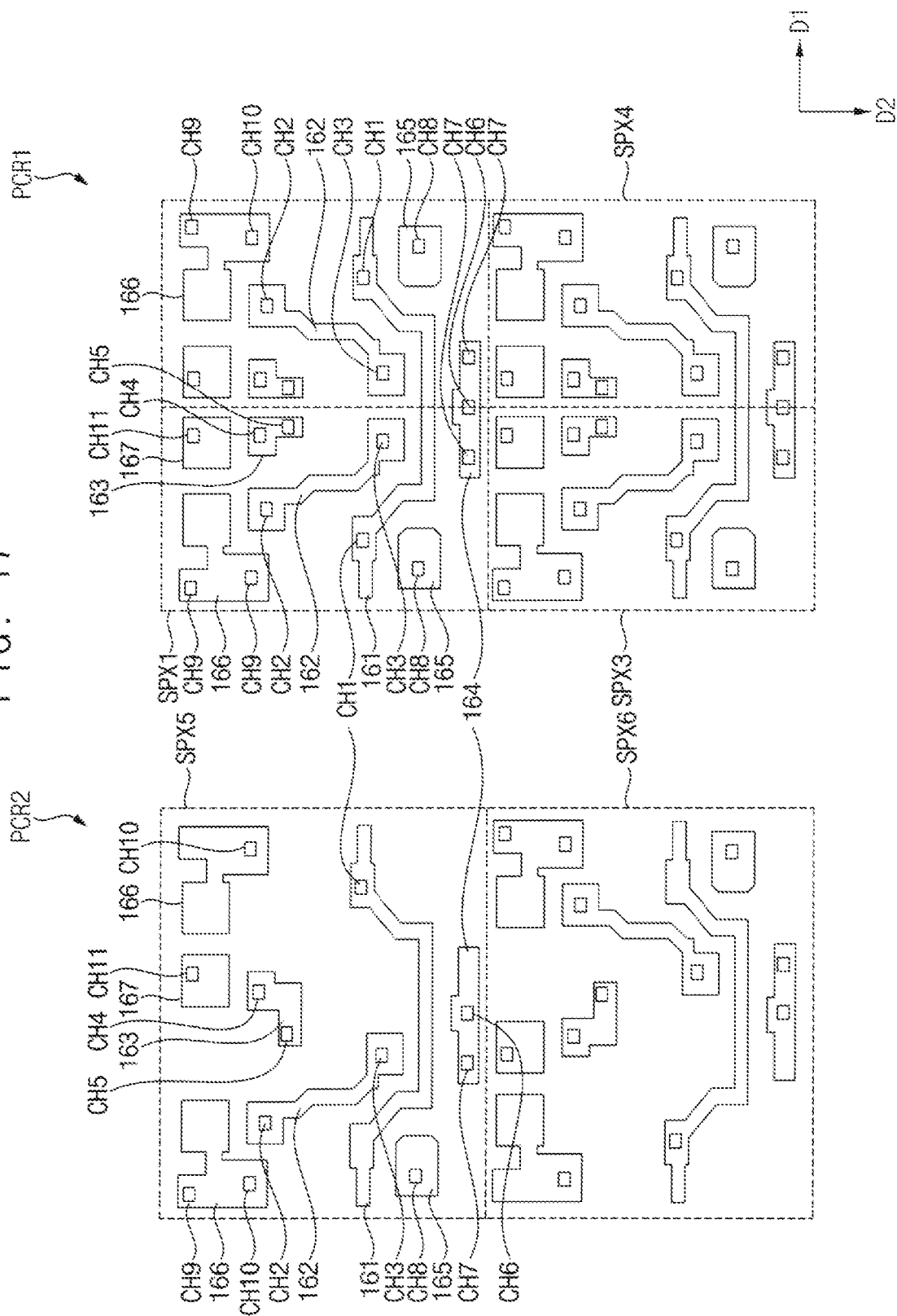
Figure 18:
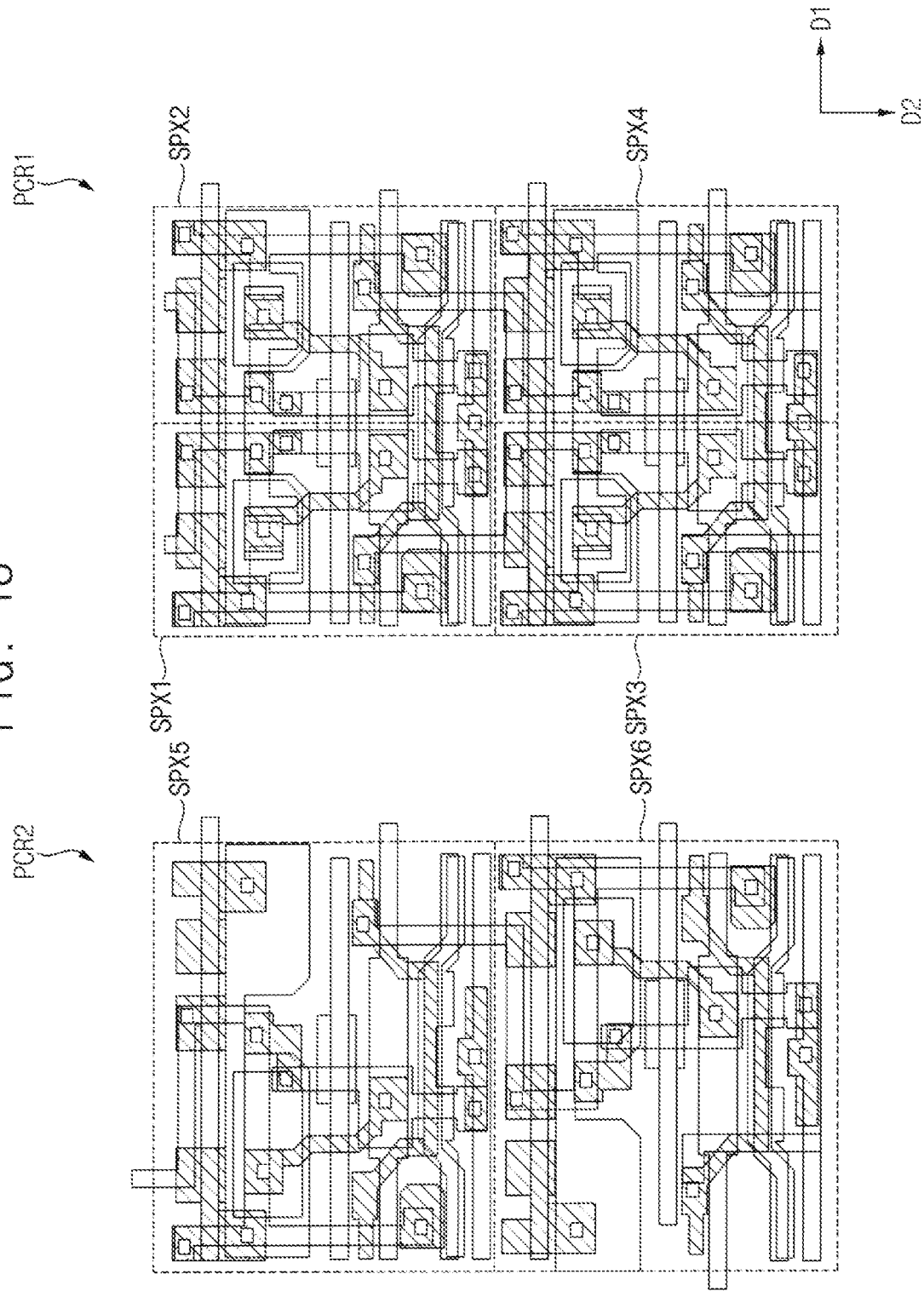
Figure 19:
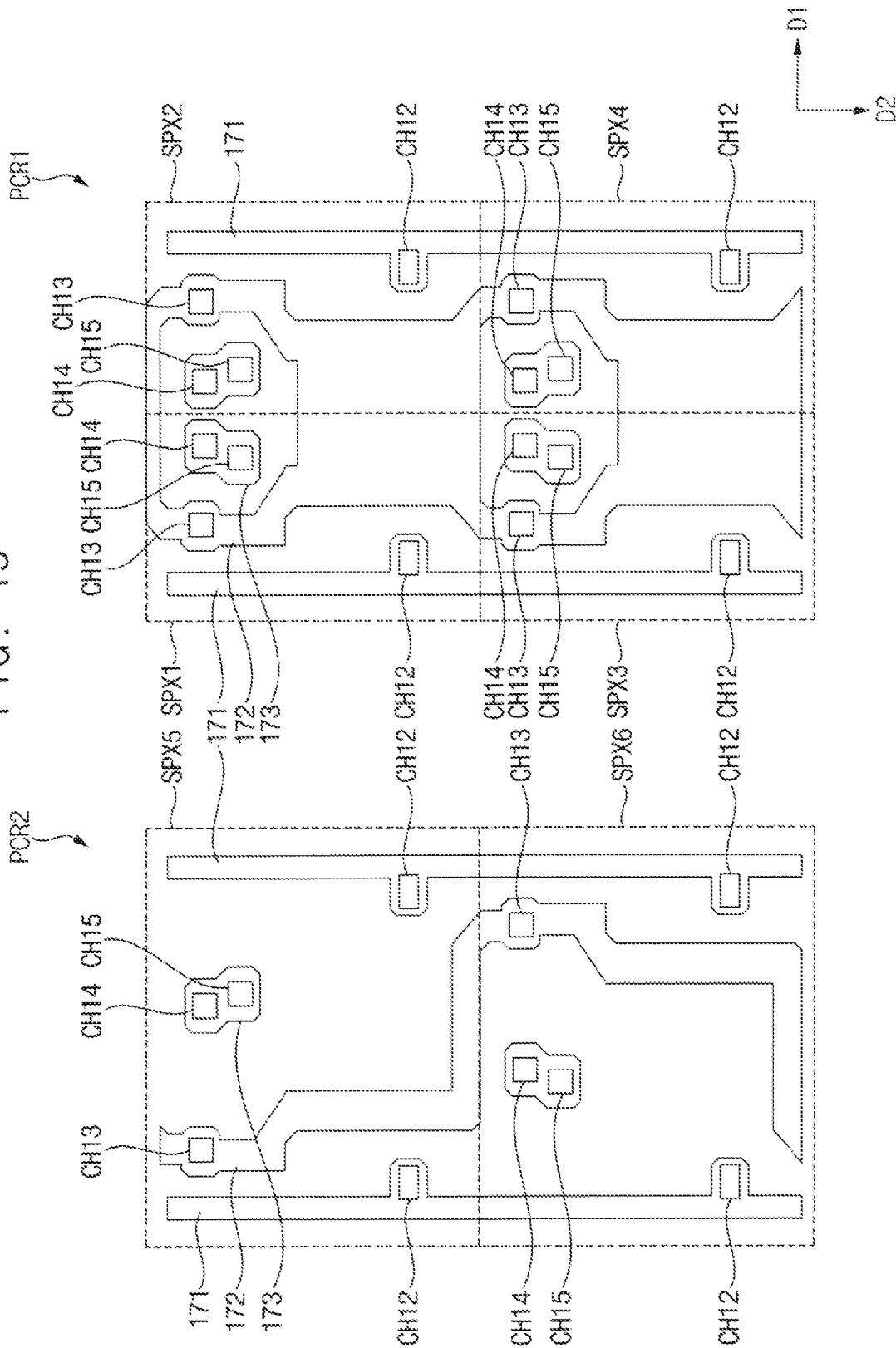

Referring to FIGS. 7 and 8, a first active layer 111 may be formed on a substrate. The substrate may be an insulating substrate including glass, quartz, plastic, and the like. According to one embodiment, the substrate may include a first flexible layer, a first barrier layer disposed on the first flexible layer, a second flexible layer disposed on the first barrier layer, and a second barrier layer disposed on the second flexible layer. The first flexible layer and the second flexible layer may include an organic insulating material such as polyimide (PI), and the first barrier layer and the second barrier layer may include an inorganic insulating material such as silicon oxide, silicon nitride, or amorphous silicon.

The first active layer 111 may include a polycrystalline silicon pattern. The polycrystalline silicon pattern may be formed of polycrystalline silicon.

The first active layer 111 may be patterned in the first pixel circuit region PCR1 to form the first sub-pixel SPX1, the second sub-pixel SPX2, the third sub-pixel SPX3, and the fourth sub-pixel SPX4. In addition, the first active layer 111 may be patterned in the second pixel circuit region PCR2 to form the fifth sub-pixel SPX5 and the sixth sub-pixel SPX6. According to the embodiment described herein, the first active layer 111 may be patterned to form a channel portion of each of the driving transistor T1, the switching transistor T2, the first emission control transistor T5, the second emission control transistor T6, and the second initialization transistor T7.

A buffer layer may be disposed between the substrate and the first active layer 111. The buffer layer may block impurities such as oxygen and moisture from diffusing to an upper portion of the substrate through the substrate. In addition, the buffer layer may provide a flat top surface on an upper portion of the substrate. The buffer layer may include an inorganic insulating material such as silicon oxide, silicon nitride, or silicon oxynitride. The buffer layer may be omitted in some implementations of this embodiment.

Referring to FIGS. 7 to 10, a first conductive layer may be formed on a resultant structure in which the first active layer 111 is formed. The first conductive layer may include a conductive material such as molybdenum (Mo) or copper (Cu).

Subsequently, the first conductive layer may be patterned in the first and second pixel circuit regions PCR1 and PCR2 to form a plurality of scan lines 121, a plurality of emission control lines 122, and a plurality of first conductive patterns 123. The scan line 121 may extend in the first direction D1. The emission control line 122 may be spaced apart from the scan line 121, and may extend in the first direction D1. The first conductive pattern 123 may have an island shape, and may be located between the scan line 121 and the emission control line 122.

The scan lines 121 and the emission control lines 122 may be configured to have the same numbers and the same shapes in the first and second pixel circuit regions PCR1 and PCR2. In the first pixel circuit region PCR1, the first conductive pattern 123 may be formed in all regions. However, in the second pixel circuit region PCR2, the first conductive pattern 123 may be formed only in the region of the odd-numbered row and the odd-numbered column and the region of the even-numbered row and the even-numbered column.

A first portion of the scan line 121 overlapping the polycrystalline silicon pattern may form a gate electrode G2 of the switching transistor T2, and a second portion of the scan line 121 overlapping the polycrystalline silicon pattern may form a gate electrode G7 of the second initialization transistor T7. A first portion of the polycrystalline silicon pattern overlapping the gate electrode G2 of the switching transistor T2 may be a channel portion of the switching transistor T2, and a second portion of the polycrystalline silicon pattern overlapping the gate electrode G7 of the second initialization transistor T7 may be a channel portion of the second initialization transistor T7. Accordingly, the polycrystalline silicon pattern and the gate electrode G2 may form the switching transistor T2, and the polycrystalline silicon pattern and the gate electrode G7 may form the second initialization transistor T7.

A first portion of the emission control line 122 overlapping the polycrystalline silicon pattern may form a gate electrode G5 of the first emission control transistor T5, and a second portion of the emission control line 122 overlapping the polycrystalline silicon pattern may form a gate electrode G6 of the second emission control transistor T6. A third portion of the polycrystalline silicon pattern overlapping the gate electrode G5 of the first emission control transistor T5 may be a channel portion of the first emission control transistor T5, and a fourth portion of the polycrystalline silicon pattern overlapping the gate electrode G6 of the second emission control transistor T6 may be a channel portion of the second emission control transistor T6. Accordingly, the polycrystalline silicon pattern and the gate electrode G5 may form the first emission control transistor T5, and the polycrystalline silicon pattern and the gate electrode G6 may form the second emission control transistor T6.

A portion of the first conductive pattern 123 overlapping the polycrystalline silicon pattern may form a gate electrode G1 of the driving transistor T1. A fifth portion of the polycrystalline silicon pattern overlapping the gate electrode G1 of the driving transistor T1 may be a channel portion of the driving transistor T1. Accordingly, the polycrystalline silicon pattern and the gate electrode G1 may form the driving transistor T1.

According to the embodiment described herein, the gate electrode G1 of the driving transistor T1 corresponding to the fifth sub-pixel SPX5 of the second pixel circuit region PCR2 may expand to a right region based on a viewpoint of an observer as compared with the gate electrode G1 of the driving transistor T1 corresponding to the first sub-pixel SPX1 of the first pixel circuit region PCR1. In addition, the gate electrode G1 of the driving transistor T1 corresponding to the sixth sub-pixel SPX6 of the second pixel circuit region PCR2 may expand to a left region based on the viewpoint of the observer as compared with the gate electrode G1 of the driving transistor T1 corresponding to the fourth sub-pixel SPX4 of the first pixel circuit region PCR1.

A first insulating layer may be additionally formed between the first active layer 111 and the first conductive layer. The first insulating layer may include an inorganic insulating material such as silicon oxide, silicon nitride, or silicon oxynitride.

Referring to FIGS. 7 to 12, a second conductive layer may be formed on a resultant structure in which the first conductive layer is formed. The second conductive layer may include a conductive material such as molybdenum (Mo) or copper (Cu). A second insulating layer may be disposed between the first conductive layer and the second conductive layer. The second insulating layer may include an inorganic insulating material such as silicon oxide, silicon nitride, or silicon oxynitride.

The second conductive layer may be patterned to form a second conductive pattern 134, a first lower gate line 131, a second lower gate line 132, and a first initialization voltage line 133. The second lower gate line 132 may be spaced apart from the first lower gate line 131, and may extend in the first direction D1. The first initialization voltage line 133 may be spaced apart from the second lower gate line 132, and may extend in the first direction D1. The second conductive pattern 134 may be spaced apart from the first lower gate line 131, and may extend in a first direction D1. The second conductive pattern 134 may overlap the first conductive pattern to form a storage capacitor CST.

Referring to FIGS. 7 to 14, a second active layer 141 may be formed on a resultant structure in which the second conductive layer is formed. The second active layer 141 may form a channel portion of each of the compensation transistor T3 and the first initialization transistor T4. According to the embodiment described herein, the second active layer 141 may be formed in an island shape in all regions of the sub-pixels SPX1, SPX2, SPX3, and SPX4 of the first pixel circuit region PCR1. The second active layer 141 may be formed in an island shape only in a region of the fifth sub-pixel SPX5 (the second quadrant region described in FIG. 7) and a region of the sixth sub-pixel SPX6 (the fourth quadrant region described in FIG. 7) of the second pixel circuit region PCR2.

The second active layer 141 may include an oxide semiconductor pattern and a metal pattern. The oxide semiconductor pattern may be formed of an oxide semiconductor including indium (In), zinc (Zn), gallium (Ga), tin (Sn), titanium (Ti), aluminum (Al), hafnium (Hf), zirconium (Zr), magnesium (Mg), and the like. For example, the oxide semiconductor pattern may include indium gallium zinc oxide (IGZO), indium tin zinc oxide (ITZO), indium zinc oxide (IZO), zinc magnesium oxide, zinc tin oxide (ZTO), zinc zirconium oxide, zinc oxide, gallium oxide, tin oxide, indium oxide, indium gallium hafnium oxide, tin aluminum zinc oxide, indium tin gallium oxide (ITGO), and the like.

The oxide semiconductor pattern may include a channel portion and a low-resistance portion formed on a side of the channel portion. According to one embodiment, the low-resistance portion may include: a first low-resistance portion formed on a first side of the channel portion; and a second low-resistance portion formed on a second side of the channel portion that is spaced apart from the first side with the channel portion interposed therebetween.

According to one embodiment, an oxygen content ratio of the low-resistance portion may be smaller than an oxygen content ratio of the channel portion. In addition, the low-resistance portion may include an oxygen vacancy that is greater than an oxygen vacancy of the channel portion. Since the oxygen vacancy may function as a carrier through which electric charges move, the low-resistance portion may have a relatively low resistance.

The metal pattern may be disposed on at least one surface of the low-resistance portion. According to one embodiment, the metal pattern may include: a first metal pattern 145 disposed on at least one surface of the first low-resistance portion; and a second metal pattern 146 disposed on at least one surface of the second low-resistance portion.

According to one embodiment, the metal pattern may be disposed on a top surface of the low-resistance portion. For example, the low-resistance portion may be disposed on a top surface of a third insulating layer, and the metal pattern may be disposed on the top surface of the low-resistance portion. In this case, the metal pattern may not be disposed on a top surface of the channel portion.

The metal pattern may make contact with the at least one surface of the low-resistance portion. In other words, the metal pattern may be disposed directly on the at least one surface of the low-resistance portion.

The metal pattern may include oxygen atoms or oxygen ions that have moved from the oxide semiconductor pattern. Since the oxygen atoms or the oxygen ions move from the oxide semiconductor pattern to the metal pattern, the oxygen vacancy of the low-resistance portion may be increased, so that the low-resistance portion may include the oxygen vacancy that greater than the oxygen vacancy of the channel portion.

The metal pattern may include at least one of tungsten (W), titanium (Ti), molybdenum (Mo), aluminum (Al), tantalum (Ta), and nitride thereof. Since the metal pattern includes the above material, the oxygen atoms or the oxygen ions may move from the oxide semiconductor pattern to the metal pattern.

The third insulating layer may be disposed between the second conductive layer and the second active layer 141. The third insulating layer may include an inorganic insulating material such as silicon oxide, silicon nitride, or silicon oxynitride.

Referring to FIGS. 7 to 16, a third conductive layer may be formed on a resultant structure in which the second active layer 141 is formed. The third conductive layer may include a conductive material such as molybdenum (Mo) or copper (Cu).

The third conductive layer may be patterned to form a first upper gate line 151 and a second upper gate line 152. The first upper gate line 151 may extend in the first direction D1. The second upper gate line 152 may be spaced apart from the first upper gate line 151, and may extend in the first direction D1.

A portion of the first lower gate line 131 overlapping the second active layer 141 may form a lower gate electrode of the compensation transistor T3, and a portion of the first upper gate line 151 overlapping the second active layer 141 may form an upper gate electrode of the compensation transistor T3. A first portion of the second active layer 141 overlapping the lower and upper gate electrodes of the compensation transistor T3 may be a channel portion of the compensation transistor T3. Accordingly, the lower gate electrode, the oxide semiconductor pattern, the metal pattern, and the upper gate electrode may form the compensation transistor T3. The compensation transistor T3 may be a transistor having a dual gate structure.

A portion of the second lower gate line 132 overlapping the second active layer 141 may form a lower gate electrode of the first initialization transistor T4, and a portion of the second upper gate line 152 overlapping the second active layer 141 may form an upper gate electrode of the first initialization transistor T4. A second portion of the second active layer 141 overlapping the lower and upper gate electrodes of the first initialization transistor T4 may be a channel portion of the first initialization transistor T4. Accordingly, the lower gate electrode, the oxide semiconductor pattern, the metal pattern, and the upper gate electrode may form the first initialization transistor T4. The first initialization transistor T4 may be a transistor having a dual gate structure.

A fourth insulating layer may be disposed between the second active layer 141 and the third conductive layer. The fourth insulating layer may include an inorganic insulating material such as silicon oxide, silicon nitride, or silicon oxynitride.

Referring to FIGS. 7 to 18, a fourth conductive layer may be formed on a resultant structure in which the third conductive layer is formed. The fourth conductive layer may include a conductive material such as aluminum (Al), titanium (Ti), or copper (Cu). According to one embodiment, the fourth conductive layer may have a multilayer structure including a titanium layer, an aluminum layer, and a titanium layer that are stacked.

The fourth conductive layer may be patterned to form a second initialization voltage line 161, a first connection pattern 162, a second connection pattern 163, a third connection pattern 164, a first contact pattern 165, a second contact pattern 166, and a third contact pattern 167.

The second initialization voltage line 161 may extend in the first direction D1. The second initialization voltage line 161 may be connected to the polycrystalline silicon pattern through a first contact hole CH1. Accordingly, the second initialization voltage line 161 may be connected to the second initialization transistor T7.

The first connection pattern 162 may extend in the second direction D2, and may be spaced apart from the second initialization voltage line 161. The first connection pattern 162 may be connected to the first conductive pattern through a second contact hole CH2, and connected to the second active layer 141 through a third contact hole CH3. In detail, the first connection pattern 162 may electrically connect the first conductive pattern to the first low-resistance portion of the oxide semiconductor pattern. Accordingly, the first low-resistance portion may be electrically connected to the first conductive pattern by the first connection pattern 162.

The second connection pattern 163 may be spaced apart from the first connection pattern 162. The second connection pattern 163 may be connected to the polycrystalline silicon pattern through a fourth contact hole CH4, and connected to the second active layer 141 through a fifth contact hole CH5. In detail, the second connection pattern 163 may electrically connect the polycrystalline silicon pattern to the second low-resistance portion of the oxide semiconductor pattern. Accordingly, the second low-resistance portion may be electrically connected to the polycrystalline silicon pattern by the second connection pattern 163.

The third connection pattern 164 may be spaced apart from the second connection pattern 163. The third connection pattern 164 may be connected to the first initialization voltage line 133 through a sixth contact hole CH6, and connected to the second active layer 141 through a seventh contact hole CH7. Accordingly, the third connection pattern 164 may connect the first initialization voltage line 133 to the second active layer 141. The first initialization voltage line 133 may be electrically connected to the first initialization transistor T4 by the third connection pattern 164.

The first contact pattern 165 may be spaced apart from the third connection pattern 164. The first contact pattern 165 may be connected to the polycrystalline silicon pattern through an eighth contact hole CH8. Accordingly, the first contact pattern 165 may be electrically connected to the switching transistor T2.

The second contact pattern 166 may be spaced apart from the first contact pattern 165. The second contact pattern 166 may be connected to the polycrystalline silicon pattern through a ninth contact hole CH9, and connected to the second conductive pattern 134 through a tenth contact hole CH10. Accordingly, the second contact pattern 166 may be electrically connected to the first emission control transistor T5 and the storage capacitor CST.

The third contact pattern 167 may be spaced apart from the second contact pattern 166. The third contact pattern 167 may be connected to the polycrystalline silicon pattern through an eleventh contact hole CH11. Accordingly, the third contact pattern 167 may be electrically connected to the second emission control transistor T6.

A fifth insulating layer may be disposed between the third conductive layer and the fourth conductive layer. The fifth insulating layer may include an inorganic insulating material such as silicon oxide, silicon nitride, or silicon oxynitride and/or an organic insulating material such as polyimide (PI).

Referring to FIGS. 7 to 19, a fifth conductive layer may be formed on a resultant structure in which the fourth conductive layer is formed. A sixth insulating layer may be disposed between the fourth conductive layer and the fifth conductive layer. The sixth insulating layer may include an inorganic insulating material such as silicon oxide, silicon nitride, or silicon oxynitride and/or an organic insulating material such as polyimide (PI).

The fifth conductive layer may be patterned to form a data line 171, a power supply voltage line 172, and a fourth contact pattern 173.

The data line 171 may extend in the second direction D2. The data line 171 may be connected to the first contact pattern 165 through a twelfth contact hole CH12. Accordingly, the data line 171 may be electrically connected to the switching transistor T2 by the first contact pattern 165.

The power supply voltage line 172 may be spaced apart from the data line 171, and may extend in the second direction D2. The power supply voltage line 172 may be connected to the second contact pattern 166 through a thirteenth contact hole CH13. Accordingly, the power supply voltage line 172 may be electrically connected to the first emission control transistor T5 and the storage capacitor CST by the second contact pattern 166.

The fourth contact pattern 173 may be spaced apart from the power supply voltage line 172. The fourth contact pattern 173 may be electrically connected to the third contact pattern 167 through a fourteenth contact hole CH14, and electrically connected to the second connection pattern 163 through a fifteenth contact hole CH15.

The method of manufacturing the first pixel circuits PXC1 and the second pixel circuits PXC2 has been described above.

The display layer DDL may be formed by sequentially forming a lower electrode, a light emitting layer, and an upper electrode on the first pixel circuits PXC1 and the second pixel circuits PXC2. The lower electrode may be an anode electrode, and the upper electrode may be a cathode electrode.

In detail, the lower electrode may be disposed on the fifth conductive layer. The lower electrode may include a conductive material such as a metal, an alloy, or transparent conductive oxide. For example, the lower electrode may include silver (Ag), indium tin oxide (ITO), and the like. According to one embodiment, the lower electrode may have a multilayer structure including an indium tin oxide layer, a silver layer, and an indium tin oxide layer that are stacked.

A seventh insulating layer may be disposed between the fifth conductive layer and the lower electrode. The seventh insulating layer may include an inorganic insulating material such as silicon oxide, silicon nitride, or silicon oxynitride and/or an organic insulating material such as polyimide (PI).

The lower electrode may be connected to the fourth contact pattern 173 through a contact hole. Accordingly, the lower electrode may be electrically connected to the second emission control transistor T6 by the third contact pattern 167 and the fourth contact pattern 173.

An eighth insulating layer may be disposed on the lower electrode. The eighth insulating layer may be disposed on the seventh insulating layer to cover the lower electrode. The eighth insulating layer may have a pixel opening that exposes at least a portion of the lower electrode. According to one embodiment, the pixel opening may expose a central portion of the lower electrode, and the eighth insulating layer may cover a peripheral portion of the lower electrode. The eighth insulating layer may include an organic insulating material such as polyimide (PI).

The light emitting layer may be disposed on the lower electrode. The light emitting layer may be disposed on the lower electrode exposed by the pixel opening. The light emitting layer may include at least one of an organic light emitting material and a quantum dot.

According to one embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, and the like, and the high molecular weight organic compound may include poly (3,4-ethylenedioxythiophene), polyaniline, poly-phenylenevinylene, polyfluorene, and the like.

According to one embodiment, the quantum dot may include a core including a group II-VI compound, a group III-V compound, a group IV-VI compound, a group IV element, a group IV compound, and a combination thereof. According to one embodiment, the quantum dot may have a core-shell structure including a core and a shell surrounding the core. The shell may serve as a protective layer for maintaining semiconductor characteristics by preventing chemical modification of the core, and serve as a charging layer for imparting electrophoretic characteristics to the quantum dot.

The upper electrode may be disposed on the light emitting layer. According to one embodiment, the upper electrode may be disposed even on the eighth insulating layer. The upper electrode may include a conductive material such as a metal, an alloy, or transparent conductive oxide. For example, the upper electrode may include aluminum (Al), platinum (Pt), silver (Ag), magnesium (Mg), gold (Au), chromium (Cr), tungsten (W), titanium (Ti), and the like. The lower electrode, the light emitting layer, and the upper electrode may form a light emitting element EL.

Figure 20:
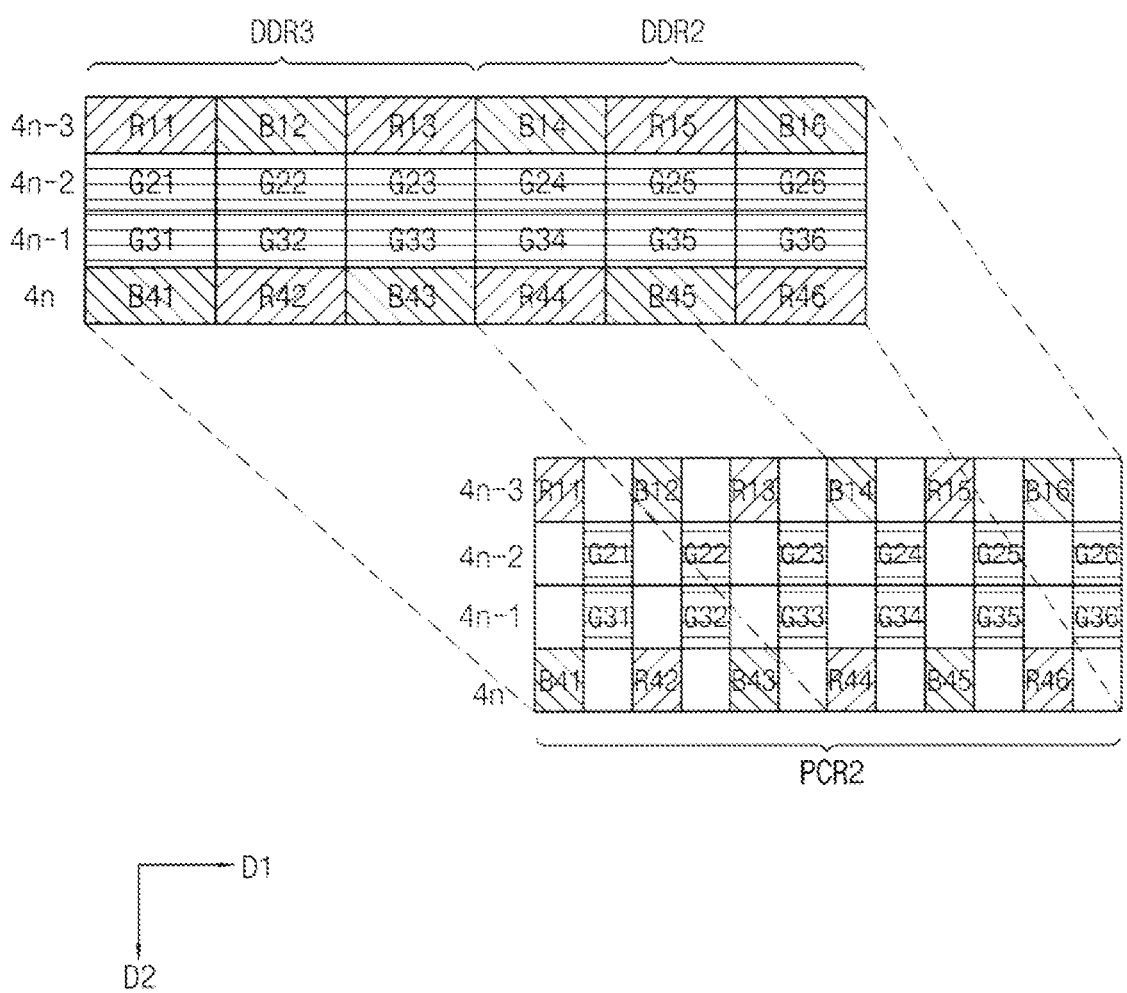
FIG. 20 is a view for describing a display device according to a second embodiment.

FIG. 20 is a view for describing a display device according to a second embodiment.

Referring to FIGS. 1 and 20, according to a second embodiment, a display device may include a circuit layer PCL disposed on a lower side, and a display layer DDL disposed on the circuit layer PCL.

The circuit layer PCL disposed on a lower side may include a pixel circuit part PCA and a driving circuit part DCA, and the pixel circuit part PCA may include a plurality of pixel circuit regions PCR.

The pixel circuit region PCR may include a first pixel circuit region PCR1 and a second pixel circuit region PCR2 that is adjacent to the driving circuit part DCA.

The display layer DDL disposed on an upper side may include a first display element region DDR1 disposed on the first pixel circuit region PCR1, a second display element region DDR2 disposed on the second pixel circuit region PCR2, and a third display element region DDR3 disposed on the driving circuit part DCA.

FIG. 20 shows only the second pixel circuit region PCR2 disposed on the lower side, and the second display element region DDR2 and the third display element region DDR3 disposed on the upper side.

In the second pixel circuit region PCR2, pixel circuits may be arranged in an odd-numbered region of a $4n^{th}$ row, and pixel circuits may be arranged in an even-numbered region of a $(4n-1)^{th}$ row. Pixel circuits may be arranged in an even-numbered region of a $(4n-2)^{th}$ row, and pixel circuits may be arranged in an odd-numbered region of a $(4n-3)^{th}$ row. In this case, the pixel circuits arranged in the even-numbered region of the $(4n-2)^{th}$ row and the pixel circuits arranged in the even-numbered region of the $(4n-1)^{st}$ row may drive a display element configured to display a green color.

According to the embodiment described herein, a channel width of the driving transistor T1 (shown in FIG. 5) and an area of the storage capacitor Cst (shown in FIG. 5) may be simultaneously expanded in each of the pixel circuits formed in the second pixel circuit region PCR2. For example, when a W/L of the driving transistor T1 formed in the first pixel circuit region PCR1 is $3/16$, a W/L of the driving transistor T1 formed in the second pixel circuit region PCR2 may be set to be $6/16$.

The display elements formed in each of the second display element region DDR2 and the third display element region DDR3 may expand in a lateral direction. Display elements corresponding to a $4n^{th}$ row may be driven by pixel circuits formed in the odd-numbered region of the $4n^{th}$ row. Display elements corresponding to a $(4n-1)^{th}$ row may be driven by pixel circuits formed in the even-numbered region of the $(4n-1)^{th}$ row. Display elements corresponding to a $(4n-2)^{th}$ row may be driven by pixel circuits formed in the even-numbered region of the $(4n-2)^{th}$ row. Display elements corresponding to a $(4n-3)^{th}$ row may be driven by pixel circuits formed in the odd-numbered region of the $(4n-3)^{th}$ row.

According to the embodiment described herein, all of the scan lines may be used for the pixel circuits formed in the second pixel circuit region PCR2, and a sub-pixel may be easily expanded. Therefore, it is unnecessary to rearrange the scan lines at a boundary portion of the first pixel circuit region PCR1.

As described above, a half of the display elements disposed in the second display element region DDR2 corresponding to a periphery of the first display element region DDR1 may be moved to the third display element region DDR3, and the display elements disposed in the second and third display element regions DDR2 and DDR3 may expand in the lateral direction.

Accordingly, a pixel density of each of the second display element region DDR2 and the third display element region DDR3 may be decreased, so that a luminance may also be decreased. Therefore, in order to compensate for the decreased luminance, a channel width of the driving transistor and an area of the storage capacitor may be simultaneously expanded in each of the pixel circuits configured to drive the display elements formed in each of the second display element region DDR2 and the third display element region DDR3.

Since the channel width of the driving transistor and the area of the capacitor are expanded, the current passing through the display element DIE may be increased so that a luminance may be increased in each of the second display element region DDR2 and the third display element region DDR3.

Figure 21:
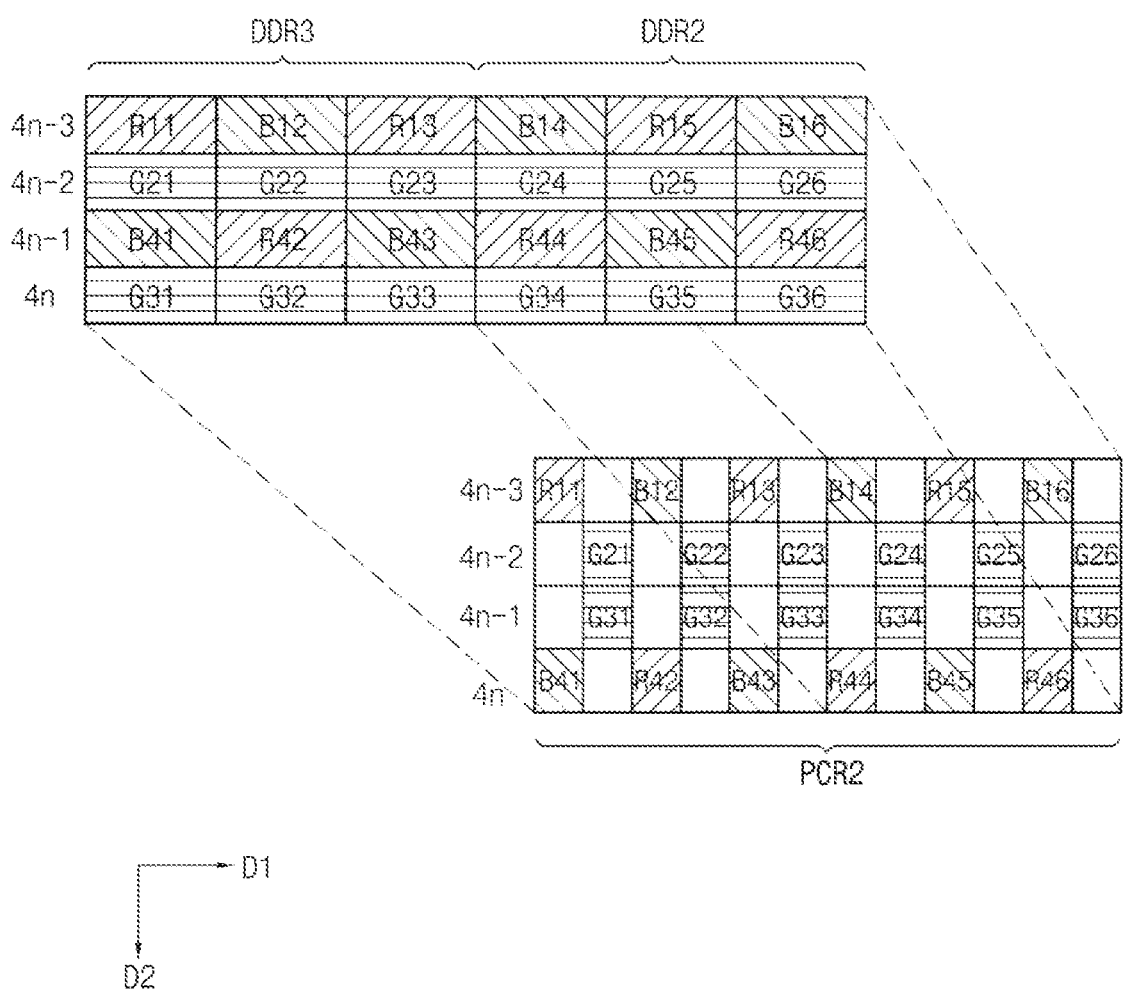
FIG. 21 is a view for describing a display device according to a third embodiment.

FIG. 21 is a view for describing a display device according to a third embodiment.

Referring to FIGS. 1 and 21, according to a third embodiment, a display device may include a circuit layer PCL disposed on a lower side, and a display layer DDL disposed on the circuit layer PCL.

The circuit layer PCL disposed on a lower side may include a pixel circuit part PCA and a driving circuit part DCA, and the pixel circuit part PCA may include a plurality of pixel circuit regions PCR.

The pixel circuit region PCR may include a first pixel circuit region PCR1 and a second pixel circuit region PCR2 that is adjacent to the driving circuit part DCA.

The display layer DDL disposed on an upper side may include a first display element region DDR1 disposed on the first pixel circuit region PCR1, a second display element region DDR2 disposed on the second pixel circuit region PCR2, and a third display element region DDR3 disposed on the driving circuit part DCA.

FIG. 21 shows only the second pixel circuit region PCR2 disposed on the lower side, and the second display element region DDR2 and the third display element region DDR3 disposed on the upper side.

In the second pixel circuit region PCR2, pixel circuits may be arranged in an odd-numbered region of a $4n^{th}$ row, and pixel circuits may be arranged in an even-numbered region of a $(4n-1)^{th}$ row. Pixel circuits may be arranged in an even-numbered region of a $(4n-2)^{th}$ row, and pixel circuits may be arranged in an odd-numbered region of a $(4n-3)^{th}$ row. In this case, the pixel circuits arranged in the even-numbered region of the $(4n-2)^{th}$ row and the pixel circuits arranged in the even-numbered region of the $(4n-2)^{th}$ row may drive a display element configured to display a green color.

According to the embodiment described herein, a channel width of the driving transistor T1 (shown in FIG. 5) and an area of the storage capacitor Cst (shown in FIG. 5) may be simultaneously expanded in each of the pixel circuits formed in the second pixel circuit region PCR2. For example, when a W/L of the driving transistor T1 formed in the first pixel circuit region PCR1 is $3/16$, a W/L of the driving transistor T1 formed in the second pixel circuit region PCR2 may be set to be $6/16$.

The display elements formed in each of the second display element region DDR2 and the third display element region DDR3 may expand in the lateral direction. Display elements corresponding to a $4n^{th}$ row may be driven by pixel circuits formed in the even-numbered region of the $(4n-1)^{th}$ row. Display elements corresponding to a $(4n-1)^{th}$ row may be driven by pixel circuits formed in the odd-numbered region of the $4n^{th}$ row. Display elements corresponding to a $(4n-2)^{th}$ row may be driven by pixel circuits formed in the even-numbered region of the $(4n-2)^{th}$ row. Display elements corresponding to a $(4n-3)^{th}$ row may be driven by pixel circuits formed in the odd-numbered region of the $(4n-3)^{th}$ row.

According to the display device of FIG. 20, the display elements arranged in the $(4n-2)^{th}$ row and the display elements arranged in the $(4n-1)^{th}$ row, which are configured to display the green color, are adjacent to each other, so that the green color may be concentrated. However, according to the display device of FIG. 21, the display elements arranged in the $4n^t$ row and the display elements arranged in the $(4n-2)^{th}$ row, which are configured to display the green color, are spaced apart from each other, so that the green color may be distributed.

As described above, a half of the display elements disposed in the second display element region DDR2 corresponding to a periphery of the first display element region DDR1 may be moved to the third display element region DDR3, and the display elements disposed in the second and third display element regions DDR2 and DDR3 may expand in the lateral direction.

Accordingly, a pixel density of each of the second display element region DDR2 and the third display element region DDR3 may be decreased, so that a luminance may also be decreased. Therefore, in order to compensate for the decreased luminance, a channel width of the driving transistor and an area of the storage capacitor may be simultaneously expanded in each of the pixel circuits configured to drive the display elements formed in each of the second display element region DDR2 and the third display element region DDR3.

Since the channel width of the driving transistor and the area of the capacitor are expanded, the current passing through the display element DIE may be increased so that a luminance may be increased in each of the second display element region DDR2 and the third display element region DDR3.

Figure 22:
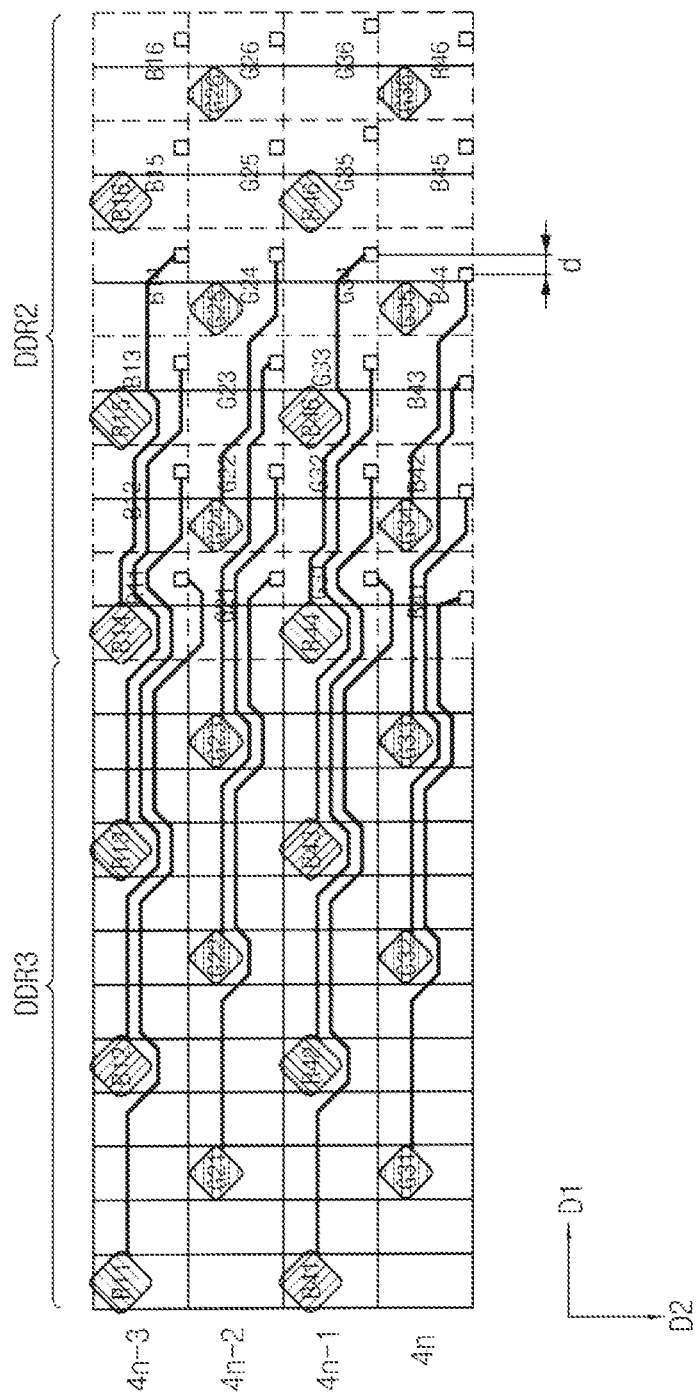
FIG. 22 is a plan view for schematically describing a bridge pattern and the display element formed in the second and third display element regions shown in FIG. 21.

FIG. 22 is a plan view for schematically describing a bridge pattern and the display element formed in the second and third display element regions DDR2 and DDR3 shown in FIG. 21.

Referring to FIGS. 21 and 22, the pixel circuits corresponding to the $(4n-2)^{th}$ row may be connected to the display elements corresponding to the $(4n-2)^{th}$ row, and the pixel circuits corresponding to the $(4n-3)^{th}$ row may be connected to the display elements corresponding to the $(4n-3)^{th}$ row.

However, the pixel circuits corresponding to the $4n^{th}$ row may be connected to the display elements corresponding to the $(4n-1)^{th}$ row, and the pixel circuits corresponding to the $(4n-1)^{th}$ row may be connected to the display elements corresponding to the $4n^{th}$ row.

In order to achieve the above connection, the anode electrodes of the display elements may be crossed so that the display elements corresponding to the $4n^{th}$ row and the display elements corresponding to the $(4n-1)^{th}$ row may be vertically moved when viewed in a plan view.

Figure 23:
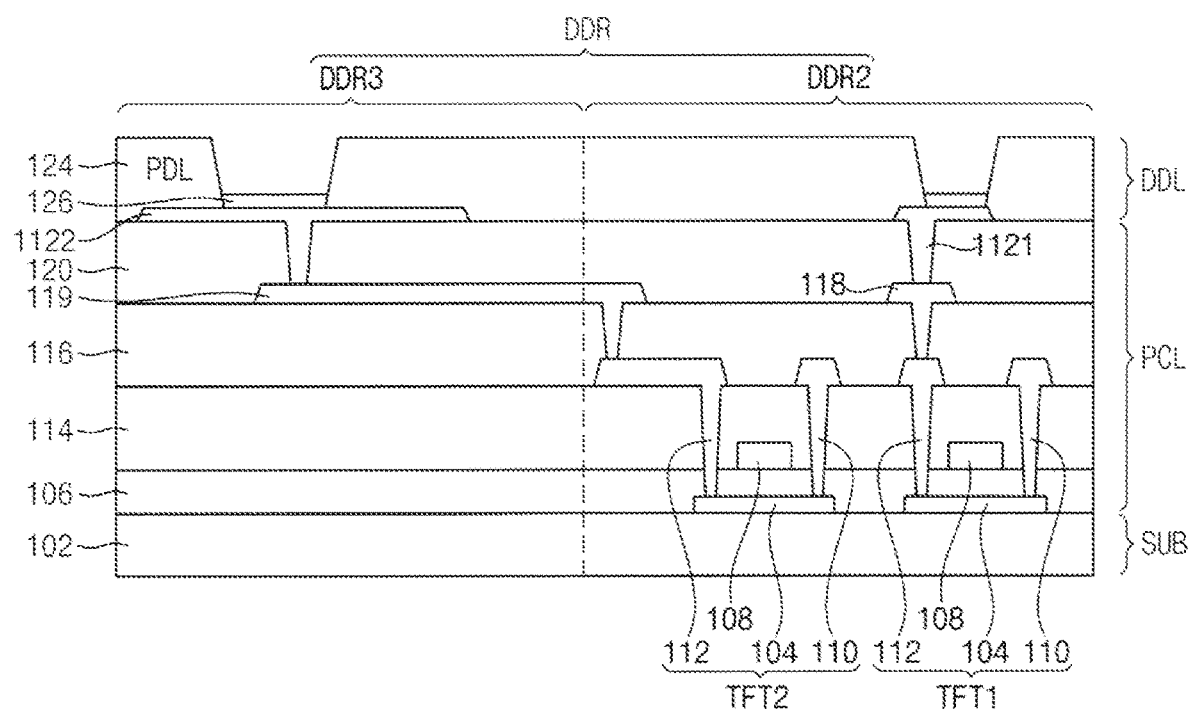
FIG. 23 is a sectional view showing an organic light emitting display device in which anode electrodes of display elements are vertically moved by using contact metals so that a 4n$^{th}$ row and a (4n−1)$^{th}$ row may intersect with each other in FIG. 22.

FIG. 23 is a sectional view showing an organic light emitting display device in which anode electrodes of display elements are vertically moved by using contact metals so that a $4n^{th}$ row and a $(4n-1)^{th}$ row may intersect with each other in FIG. 22.

Referring to FIG. 23, an organic light emitting display device may include a substrate SUB, a circuit layer PCL disposed on the substrate SUB, and a display layer DDL disposed on the circuit layer PCL.

The circuit layer PCL may include a plurality of thin film transistors formed to correspond to the second pixel circuit region PCR2 that is adjacent to the driving circuit part DCA.

In detail, an active layer 104 may be partially formed to correspond to the second pixel circuit region PCR2, and a gate insulating layer 106 that covers the whole active layer 104 may be formed. A gate electrode 108 may be partially formed on the gate insulating layer 106 corresponding to the active layer 104. A data insulating layer 114 may be formed on the gate electrode 108, and first contact holes that expose both sides of the active layer may be formed in the data insulating layer 114. A source electrode may make contact with a partial region of the active layer through one first contact hole, and a drain electrode may make contact with another partial region of the active layer through another first contact hole.

Accordingly, the thin film transistors may be formed in the second pixel circuit region PCR2. FIG. 23 shows an example where a first thin film transistor TFT1 and a second thin film transistor TFT2 are formed in the second pixel circuit region PCR2.

The drain electrode of the first thin film transistor TFT1 may be connected to a first lower electrode 1121, that is, an anode electrode of a first display element formed in the second display element region DDR2 via a first contact metal 118.

The drain electrode of the second thin film transistor TFT2 may be connected to a second lower electrode 1122 of a second display element formed in the third display element region DDR3 via a second contact metal 119.

According to the embodiment described herein, the second contact metal 119 may extend to the third display element region DDR3 so as to be connected to the second lower electrode 1122, that is, an anode electrode of the second display element. The second contact metal 119 extending to the third display element region DDR3 may be a bridge pattern.

Therefore, the pixel circuits corresponding to the $4n^{th}$ row may be connected to the display elements corresponding to the $(4n-1)^{th}$ row via the second contact metal 119 extending to the third display element region DDR3, and the pixel circuits corresponding to the $(4n-1)^{th}$ row may be connected to the display elements corresponding to the $4n^{th}$ row via the second contact metal 119 extending to the third display element region DDR3.

Figure 24:
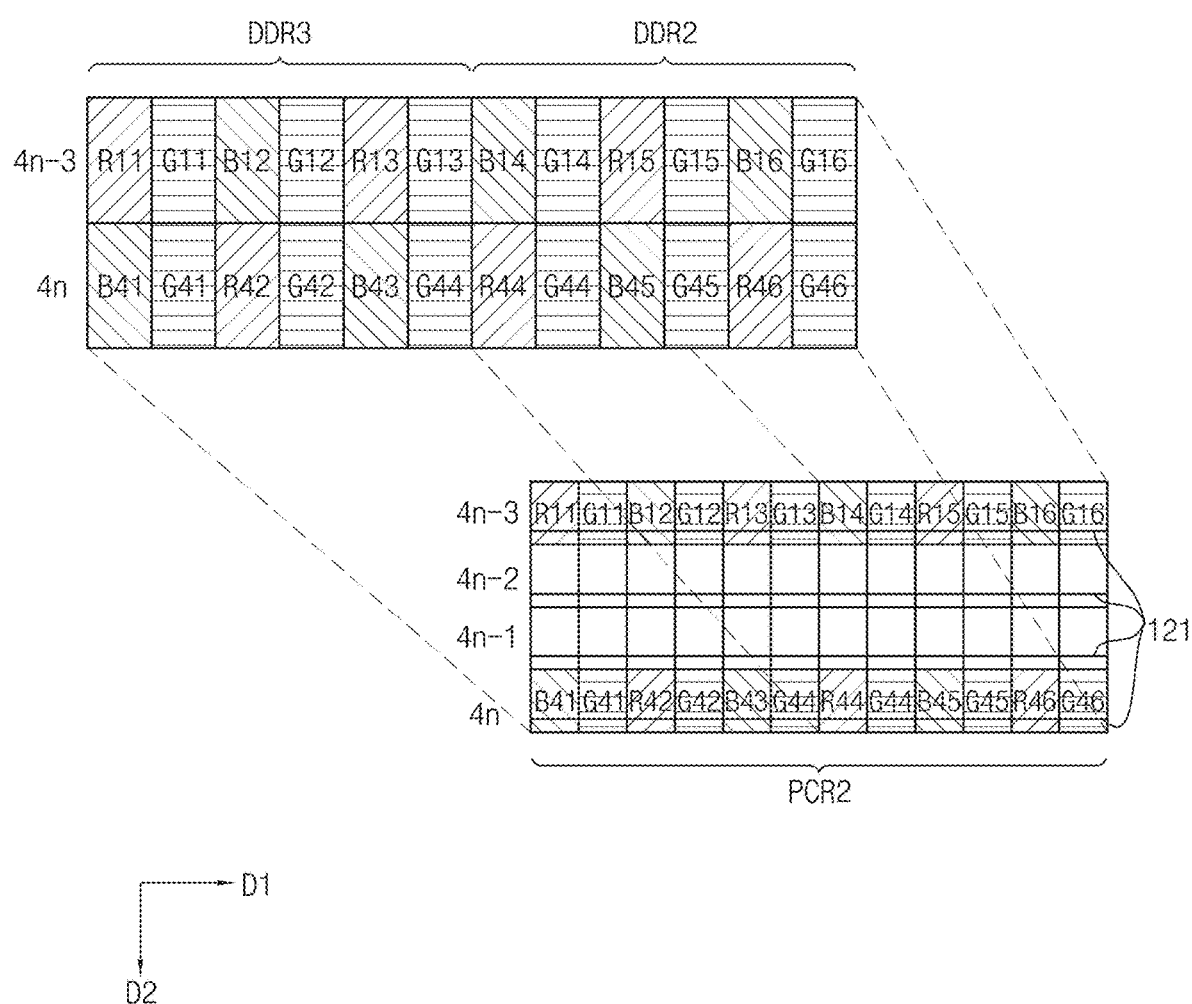
FIG. 24 is a view for describing a display device according to a fourth embodiment.

FIG. 24 is a view for describing a display device according to a fourth embodiment.

Referring to FIGS. 1 and 24, according to a fourth embodiment, a display device may include a circuit layer PCL disposed on a lower side, and a display layer DDL disposed on the circuit layer PCL.

The circuit layer PCL disposed on a lower side may include a pixel circuit part PCA and a driving circuit part DCA, and the pixel circuit part PCA may include a plurality of pixel circuit regions PCR.

The pixel circuit region PCR may include a first pixel circuit region PCR1 and a second pixel circuit region PCR2 that is adjacent to the driving circuit part DCA.

The display layer DDL disposed on an upper side may include a first display element region DDR1 disposed on the first pixel circuit region PCR1, a second display element region DDR2 disposed on the second pixel circuit region PCR2, and a third display element region DDR3 disposed on the driving circuit part DCA.

FIG. 24 shows only the second pixel circuit region PCR2 disposed on the lower side, and the second display element region DDR2 and the third display element region DDR3 disposed on the upper side.

Figure 25:
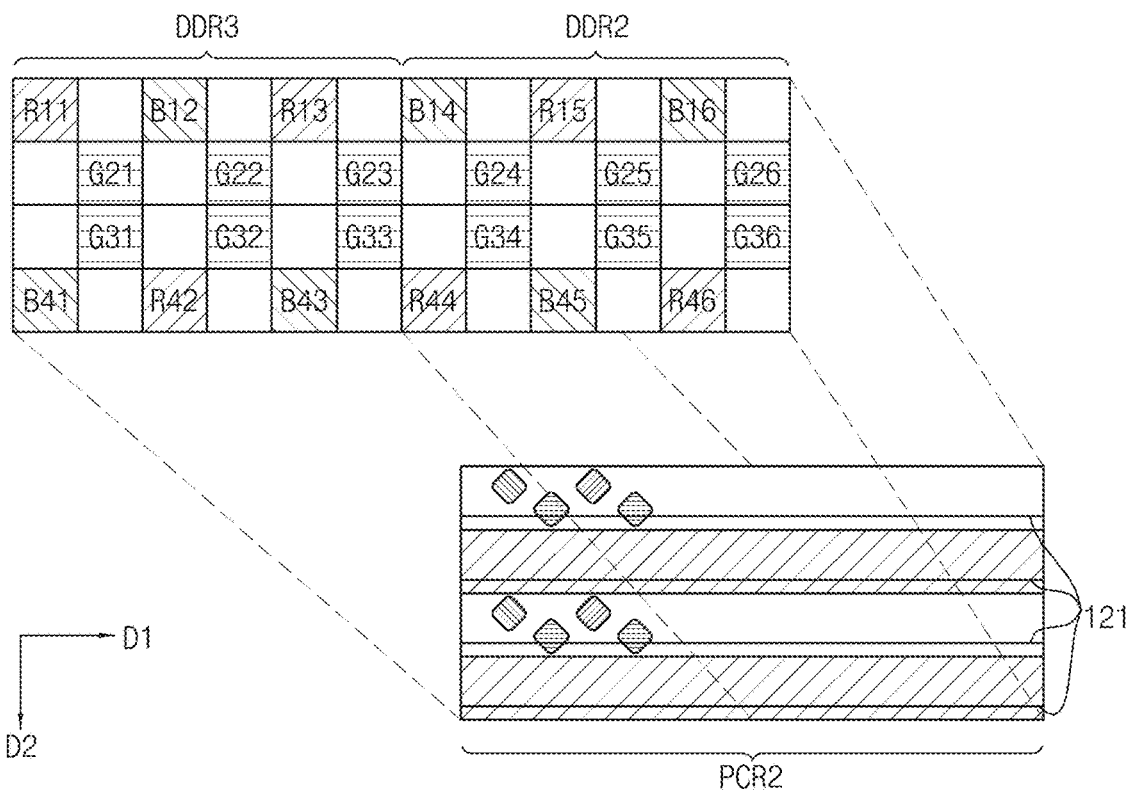
FIG. 25 is a view for describing a display device according to a fifth embodiment.

FIG. 25 is a view for describing a display device according to a fifth embodiment.

Referring to FIGS. 1 and 25, according to a fifth embodiment, a display device may include a circuit layer PCL disposed on a lower side, and a display layer DDL disposed on the circuit layer PCL.

The circuit layer PCL disposed on a lower side may include a pixel circuit part PCA and a driving circuit part DCA, and the pixel circuit part PCA may include a plurality of pixel circuit regions PCR.

The pixel circuit region PCR may include a first pixel circuit region PCR1 and a second pixel circuit region PCR2 that is adjacent to the driving circuit part DCA.

The display layer DDL disposed on an upper side may include a first display element region DDR1 disposed on the first pixel circuit region PCR1, a second display element region DDR2 disposed on the second pixel circuit region PCR2, and a third display element region DDR3 disposed on the driving circuit part DCA.

FIG. 25 shows only the second pixel circuit region PCR2 disposed on the lower side, and the second display element region DDR2 and the third display element region DDR3 disposed on the upper side.

According to the embodiment described herein, the pixel circuits provided in the circuit layer PCL and the display elements provided in the display layer DDL may have a PenTile® pixel structure. The PenTile® structure will be described as follows.

In other words, an odd-numbered pixel circuit of an odd-numbered row may be connected to an odd-numbered display element of an odd-numbered row, and an even-numbered pixel circuit of the odd-numbered row may be connected to an even-numbered display element of an even-numbered row. In addition, an odd-numbered pixel circuit of an even-numbered row may be connected to an odd-numbered display element of the even-numbered row, and an even-numbered pixel circuit of the even-numbered row may be connected to an even-numbered display element of the odd-numbered row.

According to the embodiment described herein, in the second pixel circuit region PCR2, pixel circuits may be arranged in all regions of the odd-numbered row, and pixel circuits may be deleted in all regions of the even-numbered row.

The odd-numbered display element of the odd-numbered row formed in each of the second display element region DDR2 and the third display element region DDR3 may be connected to the odd-numbered pixel circuit of the odd-numbered row formed in the second pixel circuit region PCR2 so as to be driven.

The even-numbered display element of the even-numbered row formed in each of the second display element region DDR2 and the third display element region DDR3 may be connected to the even-numbered pixel circuit of the odd-numbered row formed in the second pixel circuit region PCR2 so as to be driven.

According to the embodiment described herein, a channel width of the driving transistor T1 (shown in FIG. 5) may be set to have an expanded size in each of the pixel circuits formed in the second pixel circuit region PCR2. For example, when a W/L of the driving transistor T1 formed in the first pixel circuit region PCR1 is 3/16, a W/L of the driving transistor T1 formed in the second pixel circuit region PCR2 may be set to be 6/16.

In addition, an area of the storage capacitor Cst (shown in FIG. 5) may be set to have an expanded size in each of the pixel circuits formed in the second pixel circuit region PCR2.

As described above, a half of the display elements disposed in the second display element region DDR2 corresponding to a periphery of the first display element region DDR1 may be moved to the third display element region DDR3, and the even-numbered pixel circuit may be deleted in the second pixel circuit region PCR2.

In addition, the display elements disposed in the second and third display element regions DDR2 and DDR3 may expand in the lateral direction or a longitudinal direction.

Accordingly, a pixel density of each of the second and third display element regions DDR2 and DDR3 may be decreased, so that a luminance may also be decreased. However, in order to compensate for the decreased luminance, a channel width of the driving transistor and an area of the storage capacitor may be simultaneously expanded in each of the pixel circuits formed in each of the second and third display element regions DDR2 and DDR3.

Since the channel width of the driving transistor and the area of the capacitor are expanded, the current passing through the display element DIE may be increased so that a luminance may be increased in each of the second and third display element regions DDR2 and DDR3.

Figure 26:
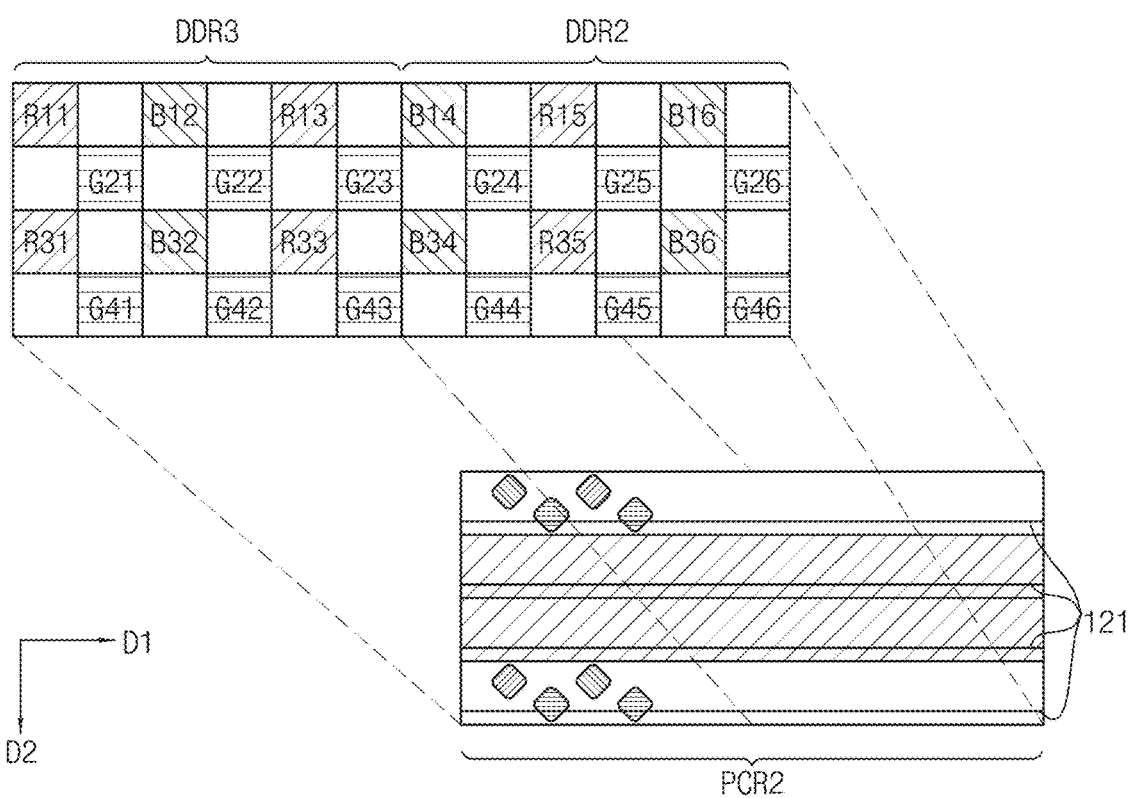
FIG. 26 is a view for describing a display device according to a sixth embodiment.

FIG. 26 is a view for describing a display device according to a sixth embodiment.

Referring to FIGS. 1 and 26, according to a sixth embodiment, a display device may include a circuit layer PCL disposed on a lower side, and a display layer DDL disposed on the circuit layer PCL.

The circuit layer PCL disposed on a lower side may include a pixel circuit part PCA and a driving circuit part DCA, and the pixel circuit part PCA may include a plurality of pixel circuit regions PCR.

The pixel circuit region PCR may include a first pixel circuit region PCR1 and a second pixel circuit region PCR2 that is adjacent to the driving circuit part DCA.

The display layer DDL disposed on an upper side may include a first display element region DDR1 disposed on the first pixel circuit region PCR1, a second display element region DDR2 disposed on the second pixel circuit region PCR2, and a third display element region DDR3 disposed on the driving circuit part DCA.

FIG. 26 shows only the second pixel circuit region PCR2 disposed on the lower side, and the second display element region DDR2 and the third display element region DDR3 disposed on the upper side.

According to the embodiment described herein, the pixel circuits provided in the circuit layer PCL and the display elements provided in the display layer DDL may have a PenTile® pixel structure.

According to the embodiment described herein, in the second pixel circuit region PCR2, pixel circuits may be arranged in all regions of the $4n^{th}$ row and the $(4n-3)^{th}$ row, and pixel circuits may be deleted in all regions of the $(4n-1)^{th}$ row and the $(4n-2)^{th}$ row.

The odd-numbered display element of the $4n^{th}$ row and the $(4n-3)^{th}$ row formed in each of the second display element region DDR2 and the third display element region DDR3 may be connected to the odd-numbered pixel circuit of the $4n^{th}$ row and the $(4n-3)^{th}$ row formed in the second pixel circuit region PCR2 so as to be driven.

The even-numbered display element of the $(4n-1)^{th}$ row and the $(4n-2)^{th}$ row formed in each of the second display element region DDR2 and the third display element region DDR3 may be connected to the even-numbered pixel circuit of the $4n^{th}$ row and the $(4n-3)^{th}$ row formed in the second pixel circuit region PCR2 so as to be driven.

According to the embodiment described herein, a channel width of the driving transistor T1 (shown in FIG. 5) may be set to have an expanded size in each of the pixel circuits formed in the second pixel circuit region PCR2. For example, when a W/L of the driving transistor T1 formed in the first pixel circuit region PCR1 is 3/16, a W/L of the driving transistor T1 formed in the second pixel circuit region PCR2 may be set to be 6/16.

In addition, an area of the storage capacitor Cst (shown in FIG. 5) may be set to have an expanded size in each of the pixel circuits formed in the second pixel circuit region PCR2.

As described above, a half of the display elements disposed in the second display element region DDR2 corresponding to a periphery of the first display element region DDR1 may be moved to the third display element region DDR3, and pixel circuits may be deleted in all regions of the $(4n-1)^{th}$ row and the $(4n-2)^{th}$ row in the second pixel circuit region PCR2. In addition, the display elements disposed in the second and third display element regions DDR2 and DDR3 may expand in the lateral direction or the longitudinal direction.

Accordingly, a pixel density of each of the second and third display element regions DDR2 and DDR3 may be decreased, so that a luminance may also be decreased. However, in order to compensate for the decreased luminance, a channel width of the driving transistor and an area of the storage capacitor may be simultaneously expanded in each of the pixel circuits formed in each of the second and third display element regions DDR2 and DDR3.

Since the channel width of the driving transistor and the area of the capacitor are expanded, the current passing through the display element DIE may be increased so that a luminance may be increased in each of the second and third display element regions DDR2 and DDR3.

As described above, according to the embodiments described hereinabove, a current supplied to each of the display elements formed in the second and third display element regions may be increased more as compared with a current supplied to each of the display elements formed in the first display element region. Therefore, even when the display elements are distributed from the second display element region to the third display element region in order to expand a display region by reducing a non-display region, a decrease in a luminance that may be caused by a decrease in a pixel density may be prevented.

The embodiments described hereinabove may be applied to an organic light emitting display device and an electronic device including the same. For example, the embodiments described hereinabove may be applied to TV, digital TV, 3D TV, PC, home electronic device, notebook computer, tablet computer, mobile phone, smart phone, PDA, PMP, digital camera, music player, portable game console, navigation, or the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claims is:

1. A display device comprising:
   a substrate;
   a circuit layer disposed on the substrate, the circuit layer including a pixel circuit part having a first pixel circuit region and a second pixel circuit region, and a driving circuit part that is adjacent to the pixel circuit part; and
   a display layer disposed on the circuit layer, and which includes a first display element region that overlaps the first pixel circuit region, a second display element region that overlaps the second pixel circuit region, and a third display element region that overlaps the driving circuit part,
   wherein pixel circuits formed in the first pixel circuit region are configured to supply a first current to display elements formed in the first display element region,
   wherein pixel circuits formed in the second pixel circuit region are configured to supply a second current to display elements formed in the second and third display element regions, and
   wherein the display elements in each second display element region and the display elements in each third display element region have an area that is greater than a corresponding area of the display elements in the first display element region.

2. The display device of claim 1, wherein the second current is greater than the first current.

3. The display device of claim 1, further comprising a driving transistor formed in each of the first and second pixel circuit regions, the driving circuit part configured to control an amount of a current flowing from a first power supply to a second power supply via a respective display element, and the display element includes an organic light emitting element.

4. The display device of claim 3, wherein a light emitting region of an organic light emitting element formed in each of the second and third display element regions has an area that is two times or more greater than in a light emitting region of an organic light emitting element formed in the first display element region.

5. The display device of claim 1, wherein a channel width of a driving transistor formed in the second pixel circuit region is greater than a channel width of a driving transistor formed in the first pixel circuit region.

6. The display device of claim 1, wherein a channel width/channel length (W/L) of a driving transistor formed in the second pixel circuit region is two times or more greater than a W/L of a driving transistor formed in the first pixel circuit region.

7. The display device of claim 1, further comprising a first storage capacitor formed in the first pixel circuit region and a second storage capacitor formed in the second pixel circuit region, wherein an area of the second storage capacitor is greater than an area of the first storage capacitor.

8. The display device of claim 1, wherein, in the second pixel circuit region, pixel circuits are arranged in an odd-numbered region of a 4nth row, n being a positive integer greater than or equal to one, pixel circuits are arranged in an even-numbered region of a (4n−1)th row, pixel circuits are arranged in an even-numbered region of a (4n−2)th row, and pixel circuits are arranged in an odd-numbered region of a (4n−3)th row.

9. The display device of claim 8, wherein display elements corresponding to each of the second and third display element regions expand in a lateral direction.

10. The display device of claim 9, wherein the pixel circuits arranged in the odd-numbered region of the 4nth row are configured to drive display elements arranged in a region of a 4nth row of the display layer, the pixel circuits arranged in the even-numbered region of the (4n−1)th row are configured to drive display elements arranged in a region of a (4n−1)th row of the display layer, the pixel circuits arranged in the even-numbered region of the (4n−2)th row are configured to drive display elements arranged in a region of a (4n−2)th row of the display layer, and the pixel circuits arranged in the odd-numbered region of the (4n−3)th row are configured to drive display elements arranged in a region of a (4n−3)th row of the display layer.

11. The display device of claim 9, wherein the pixel circuits arranged in the odd-numbered region of the 4nth row are configured to drive display elements arranged in a region of a (4n−1)th row of the display layer, the pixel circuits arranged in the even-numbered region of the (4n−1)th row are configured to drive display elements arranged in a region of a 4nth row of the display layer, the pixel circuits arranged in the even-numbered region of the (4n−2)th row are configured to drive display elements arranged in a region of a (4n−2)th row of the display layer, and the pixel circuits arranged in the odd-numbered region of the (4n−3)th row are configured to drive display elements arranged in a region of a (4n−3)th row of the display layer.

12. The display device of claim 11, wherein each display element includes an organic light emitting element, and wherein the pixel circuits arranged in the odd-numbered region of the 4nth row drive organic light emitting elements arranged in the region of the (4n−1)th row of the display layer by way of an anode of an organic light emitting element formed in the third display element region that extends to the second display element region so as to be connected to a driving transistor of a pixel circuit.

13. The display device of claim 11, wherein each display element includes an organic light emitting element, and wherein the pixel circuits arranged in the even-numbered region of the (4n−1)$^{th}$ row drive organic light emitting elements arranged in the region of the 4n$^{th}$ row of the display layer by way of an anode of an organic light emitting element formed in the third display element region that extends to the second display element region so as to be connected to a driving transistor of a pixel circuit.

14. The display device of claim 1, wherein, in the second pixel circuit region, pixel circuits are arranged in a region of a 4nth row (n is a positive integer greater than or equal to one), and pixel circuits are arranged in a region of a (4n−3)th row.

15. The display device of claim 14, wherein display elements corresponding to each of the second and third display element regions expand in a longitudinal direction.

16. The display device of claim 15, wherein the pixel circuits arranged in the region of the 4nth row are configured to drive display elements arranged in a region of a 4nth row of the display layer and expanding in the longitudinal direction, and the pixel circuits arranged in the region of the (4n−3)th row are configured to drive display elements arranged in a region of a (4n−3)th row of the display layer and expanding in the longitudinal direction.

17. The display device of claim 1, wherein pixel circuits provided in the circuit layer and display elements provided in the display layer have an arrangement comprising:

an odd-numbered pixel circuit of an odd-numbered row is electrically connected to an odd-numbered display element of an odd-numbered row, and an even-numbered pixel circuit of the odd-numbered row is connected to an even-numbered display element of an even-numbered row; and an odd-numbered pixel circuit of an even-numbered row is connected to an odd-numbered display element of the even-numbered row, and an even-numbered pixel circuit of the even-numbered row is connected to an even-numbered display element of the odd-numbered row.

18. The display device of claim 1, wherein each first pixel circuit region in the circuit layer has a first area that is greater than a corresponding second area of each second pixel circuit region in the circuit layer.

19. A display device comprising:

a substrate;

a circuit layer disposed on the substrate, and which includes a pixel circuit part having a first pixel circuit region provided with a plurality of first pixel circuits and a second pixel circuit region provided with a plurality of second pixel circuits connected to scan lines to which the first pixel circuits are respectively connected, and a driving circuit part that is adjacent to the pixel circuit part; and a display layer disposed on the circuit layer, and which includes a first display element region that overlaps the first pixel circuit region and provided with a plurality of first display elements respectively connected to the first pixel circuits, a second display element region that overlaps the second pixel circuit region and provided with a plurality of second display elements respectively connected to a half of the second pixel circuits, and a third display element region that overlaps the driving circuit part and provided with a plurality of third display elements respectively connected to a remaining half of the second pixel circuits, wherein a channel width of a driving transistor provided in the second pixel circuit is greater than a channel width of a driving transistor provided in the first pixel circuit, and wherein the second display elements in each second display element region and the third display elements in each third display element region have an area that is greater than a corresponding area of the first display elements in the first display element region.

20. The display device of claim 19, wherein a channel width/channel length (W/L) of a driving transistor formed in the second pixel circuit region is two times or more greater than a W/L of a driving transistor formed in the first pixel circuit region.

21. The display device of claim 19, wherein a light emitting region of a display element formed in each of the second and third display element regions is two times or more greater than a light emitting region of a display element formed in the first pixel circuit region.

22. The display device of claim 19, wherein a light emitting region of a display element formed in each of the second and third display element regions is larger than a light emitting region of a display element formed in the first pixel circuit region.

23. The display device of claim 19, wherein a light emitting region of a display element formed in each of the second and third display element regions expands in a lateral direction.

24. A display device comprising:
- a substrate;
- a circuit layer disposed on the substrate, and which includes a pixel circuit part having a first pixel circuit region provided with a plurality of first pixel circuits and a second pixel circuit region provided with a plurality of second pixel circuits connected to a half of scan lines to which the first pixel circuits are connected, and a driving circuit part that is adjacent to the pixel circuit part; and
- a display layer disposed on the circuit layer, and which includes a first display element region that overlaps the first pixel circuit region and provided with a plurality of first display elements respectively connected to the first pixel circuits, a second display element region that overlaps the second pixel circuit region and provided with a plurality of second display elements respectively connected to a half of the second pixel circuits, and a third display element region that overlaps the driving circuit part and provided with a plurality of third display elements respectively connected to a remaining half of the second pixel circuits,
- wherein a channel width of a driving transistor provided in the second pixel circuit is greater than a channel width of a driving transistor provided in the first pixel circuit.

25. The display device of claim 24, wherein a light emitting region of a display element formed in each of the second and third display element regions expands in a longitudinal direction.

26. The display device of claim 24, wherein a light emitting region of a display element formed in each of the second and third display element regions expands in a lateral direction.

27. The display device of claim 26, wherein the second pixel circuit includes:
- a first thin film transistor including a drain electrode connected to a lower electrode of a second display element, which is formed in the second display element region, via a first contact metal; and
- a second thin film transistor including a drain electrode connected to a lower electrode of a third display element, which is formed in the third display element region, via a second contact metal.

28. The display device of claim 27, wherein a second pixel circuit formed in a 4nth row, wherein n is a positive integer greater than or equal to one, is connected to a display element formed in a (4n−1)th row via a second contact metal extending to the third display element region, and
- a second pixel circuit formed in a (4n−1)th row is connected to a display element formed in a 4nth row via a second contact metal extending to the third display element region.

29. The display device of claim 24, wherein, in the second pixel circuit region, pixel circuits are provided in an odd-numbered row, and pixel circuits are deleted in an even-numbered row.

30. The display device of claim 29, wherein an odd-numbered display element formed in an odd-numbered row of each of the second and third display element regions is connected to an odd-numbered pixel circuit in the odd-numbered row of the second pixel circuit region, and
- an even-numbered display element formed in an even-numbered row of each of the second and third display element regions is connected to an even-numbered pixel circuit in the odd-numbered row of the second pixel circuit region.

31. The display device of claim 24, wherein, in the second pixel circuit region, pixel circuits are provided in a 4nth row and a (4n−3)th row, and pixel circuits are deleted in a (4n−1)th row and a (4n−2)th row.

32. The display device of claim 31, wherein an odd-numbered display element formed in a 4nth row and a (4n−3)th row of each of the second and third display element regions is connected to an odd-numbered pixel circuit formed in the 4nth row and the (4n−3)th row of the second pixel circuit region, and
- an even-numbered display element formed in a (4n−1)th row and a (4n−2)th row of each of the second and third display element regions is connected to an even-numbered pixel circuit formed in the 4nth row and the (4n−3)th row of the second pixel circuit region.

* * * * *